United States Patent
Lin et al.

(10) Patent No.: US 12,402,322 B2
(45) Date of Patent: Aug. 26, 2025

(54) COMMON-CONNECTION METHOD IN 3D MEMORY

(71) Applicant: Taiwan Semiconductor Manufacturing Company, Ltd., Hsinchu (TW)

(72) Inventors: Meng-Han Lin, Hsinchu (TW); Chia-En Huang, Hsinchu County (TW); Yi-Ching Liu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 93 days.

(21) Appl. No.: 18/361,425

(22) Filed: Jul. 28, 2023

(65) Prior Publication Data

US 2025/0040143 A1    Jan. 30, 2025

Related U.S. Application Data

(63) Continuation of application No. 17/185,229, filed on Feb. 25, 2021, now Pat. No. 11,758,735.

(51) Int. Cl.
*H10B 51/30* (2023.01)
*H01L 23/528* (2006.01)
(Continued)

(52) U.S. Cl.
CPC ........... *H10B 51/30* (2023.02); *H01L 23/528* (2013.01); *H10B 51/10* (2023.02); *H10B 51/20* (2023.02)

(58) Field of Classification Search
CPC ............. H01L 23/528; H01L 29/41741; H01L 29/41775; H10B 51/10; H10B 51/20; H10B 51/30
See application file for complete search history.

(56) References Cited

U.S. PATENT DOCUMENTS

| | | |
|---|---|---|
| 11,587,823 B2 | 2/2023 | Chia et al. |
| 2020/0026990 A1 | 1/2020 | Lue |

(Continued)

FOREIGN PATENT DOCUMENTS

| | | | | |
|---|---|---|---|---|
| DE | 10 2021 101 243 A1 | 12/2021 | | |
| WO | WO-2020086566 A1 * | 4/2020 | ......... | H01L 27/0688 |
| WO | 20220010027 A * | 1/2022 | ........... | H01L 29/518 |

*Primary Examiner* — Matthew E Warren
(74) *Attorney, Agent, or Firm* — FOLEY & LARDNER LLP

(57) ABSTRACT

One aspect of this description relates to a semiconductor device. In some embodiments, the semiconductor device includes a first drain/source structure extending in a first direction, a second drain/source structure extending the first direction and spaced from the first drain/source structure in a second direction perpendicular to the first direction, a third drain/source structure extending in the first direction and spaced from the second drain/source structure in the second direction, a first bit line disposed over the first drain/source structure in the first direction, a common select line that includes a portion disposed over the second drain/source structure in the first direction, a second bit line disposed over the third drain/source structure in the first direction, and a charge storage layer coupled to at least a first sidewall of each of the first drain/source structure, the second drain/source structure, and the third drain/source structure.

20 Claims, 28 Drawing Sheets

(51) Int. Cl.
H10B 51/10 (2023.01)
H10B 51/20 (2023.01)

(56) References Cited

U.S. PATENT DOCUMENTS

2021/0399016 A1* 12/2021 Jiang ................. H10B 51/20
2021/0407848 A1* 12/2021 Chia ................. H01L 21/76237
2022/0399400 A1* 12/2022 Takashima ............. H10B 63/10
2023/0048842 A1* 2/2023 Lin ................. H10B 53/30

* cited by examiner

COMMON-CONNECTION METHOD IN 3D MEMORY

CROSS-REFERENCE TO RELATED APPLICATION

This application is a Continuation of U.S. patent application Ser. No. 17/185,229, filed Feb. 25, 2021, the entire disclosure of which is incorporated herein by reference for all purposes.

BACKGROUND

Developments in electronic devices, such as computers, portable devices, smart phones, internet of thing (IoT) devices, etc., have prompted increased demands for memory devices. In general, memory devices may be volatile memory devices and non-volatile memory devices. Volatile memory devices can store data while power is provided but may lose the stored data once the power is shut off. Unlike volatile memory devices, non-volatile memory devices may retain data even after the power is shut off but may be slower than the volatile memory devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
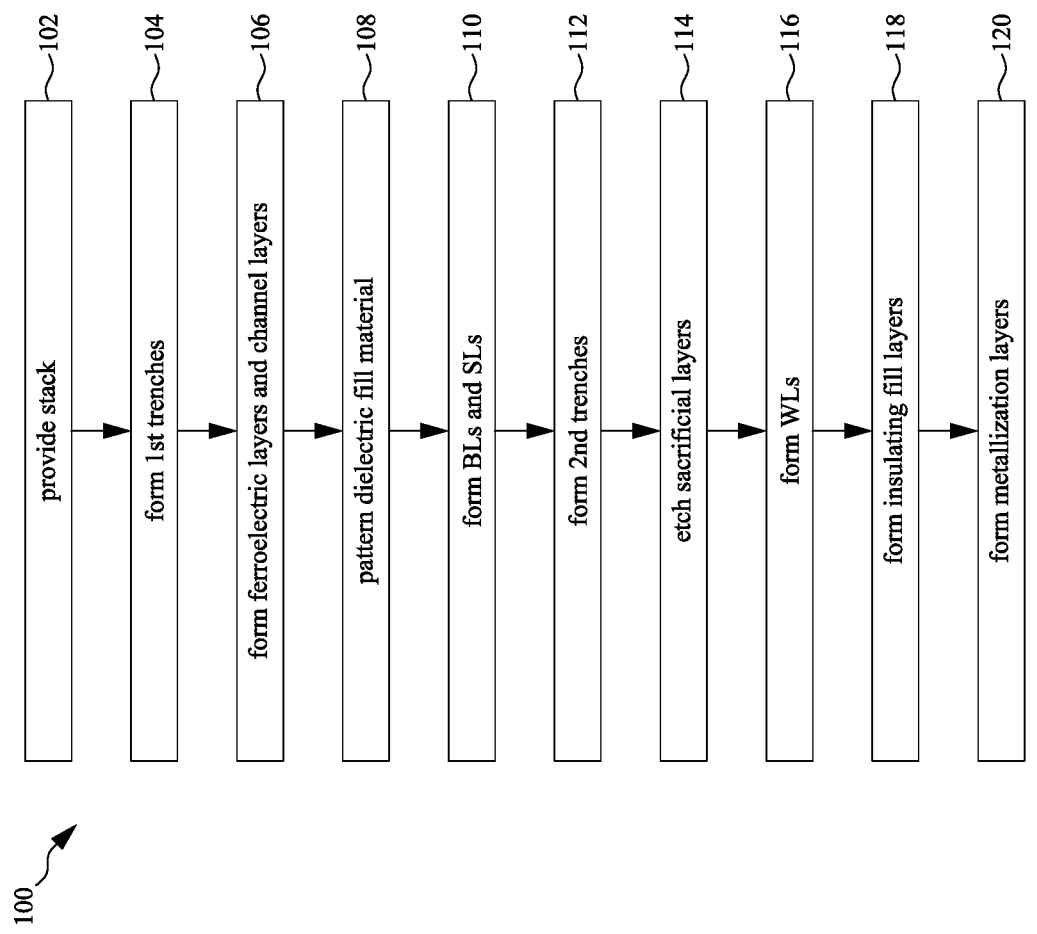
FIG. 1 illustrates a flow chart of an example method for making a three-dimensional memory device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides various embodiments of a three-dimensional (3D) memory device, and methods of forming the same. The 3D memory device, as disclosed herein, includes a number of memory cells formed as a memory array. The memory cells are formed across multiple memory levels (or tiers) over a substrate. Each of the memory cells is implemented as a ferroelectric memory cell. For example, each ferroelectric memory cell can be constituted by at least one of: a portion of a semiconductor channel layer that continuously extends along a vertical direction of the array, a portion of a ferroelectric layer that also continuously extends along the vertical direction of the array, one of a number of first conductive structures (functioning as its gate electrode) that continuously extends along a lateral direction of the array, a second conductive structure (functioning as its source electrode) that continuously extends along the vertical lateral direction of the array, and a third conductive structure (functioning as its drain electrode) that continuously extends along the vertical lateral direction of the array. The gate electrodes, drain electrodes, and source electrodes may sometimes be referred to as "word line (WL)," "bit line (BL)," and "source/select line (SL)," respectively.

In accordance with some embodiments, a 3D memory system includes a plurality of memory cells. An exemplary memory cell includes a first drain/source structure, a second drain/source structure spaced from the first drain/source structure in a first direction, and a third drain/source structure spaced from the second drain/source structure in the first direction. The memory cell includes a charge storage layer coupled to at least a first sidewall of each of the first drain/source structure, the second drain/source structure, and the third drain/source structure. The memory cell includes a first metallization layer representing a first bit line disposed over the first drain/source structure, a second metallization layer representing a common source/select line disposed over the second drain/source structure, and a third metallization layer representing a third bit line disposed over the third drain/source structure.

Advantageously, the 3D memory system employing the disclosed memory cell can achieve several benefits. In one aspect, the 3D memory system can save memory area by sharing the select line between two transistor device structures. Accordingly, a die and a wafer can include a higher number of 3D memory systems to reduce a cost of fabrication per 3D memory system.

In general, a ferroelectric memory device (sometimes referred to as a "ferroelectric random access memory (FeRAM)" device) contains a ferroelectric material to store information. The ferroelectric material acts as the memory material of the memory device. The dipole moment of the ferroelectric material is programmed in two different orientations (e.g., "up" or "down" polarization positions based on oxygen atom position in the crystal lattice) depending on the polarity of the applied electric field to the ferroelectric material to store information in the ferroelectric material. The different orientations of the dipole moment of the ferroelectric material can be detected by the electric field generated by the dipole moment of the ferroelectric material. For example, the orientation of the dipole moment can be detected by measuring electrical current passing through a semiconductor channel provided adjacent to the ferroelectric material. Although the following discussed embodiments of the disclosed 3D memory device are directed to a ferroelectric memory device, it should be appreciated that some of the embodiments may be used in any of various other types of 3D non-volatile memory devices (e.g., magnetoresistive random access memory (MRAM) devices, phase-change random access memory (PCRAM) devices, etc.), while remaining within the scope of the present disclosure.

FIG. 1 illustrates a flowchart of a method 100 to form a 3D memory device, according to one or more embodiments of the present disclosure. For example, at least some of the operations (or steps) of the method 100 can be used to form a 3D ferroelectric memory device. It is noted that the method 100 is merely an example, and is not intended to limit the present disclosure. Accordingly, it is understood that additional operations may be provided before, during, and after the method 100 of FIG. 1, and that some other operations may only be briefly described herein. In some embodiments, operations of the method 100 may be associated with perspective and/or top views of an example 3D memory device at various fabrication stages as shown in FIGS. 2, 3, 4, 5, 6, 7, 8, 9, 10, 11A, and 11B, respectively, which will be discussed in further detail below.

In brief overview, the method 100 starts with operation 102 of providing a stack of insulating layers and sacrificial layers over a substrate. The method 100 continues to operation 104 of forming a number of first trenches. The method 100 continues to operation 106 of forming a number of ferroelectric layers and a number of channel layers. The method 100 continues to operation 108 of patterning a dielectric fill material. The method 100 continues to operation 110 of forming a number of bit lines and a number of source/select lines. The method 100 continues to operation 112 of forming a number of second trenches. The method 100 continues to operation 114 of etching sacrificial layers. The method 100 continues to operation 116 of forming a number of word lines. The method 100 continues to operation 118 of forming insulating fill layers. The method continues to operation 120 of forming metallization layers.

Figure 2:
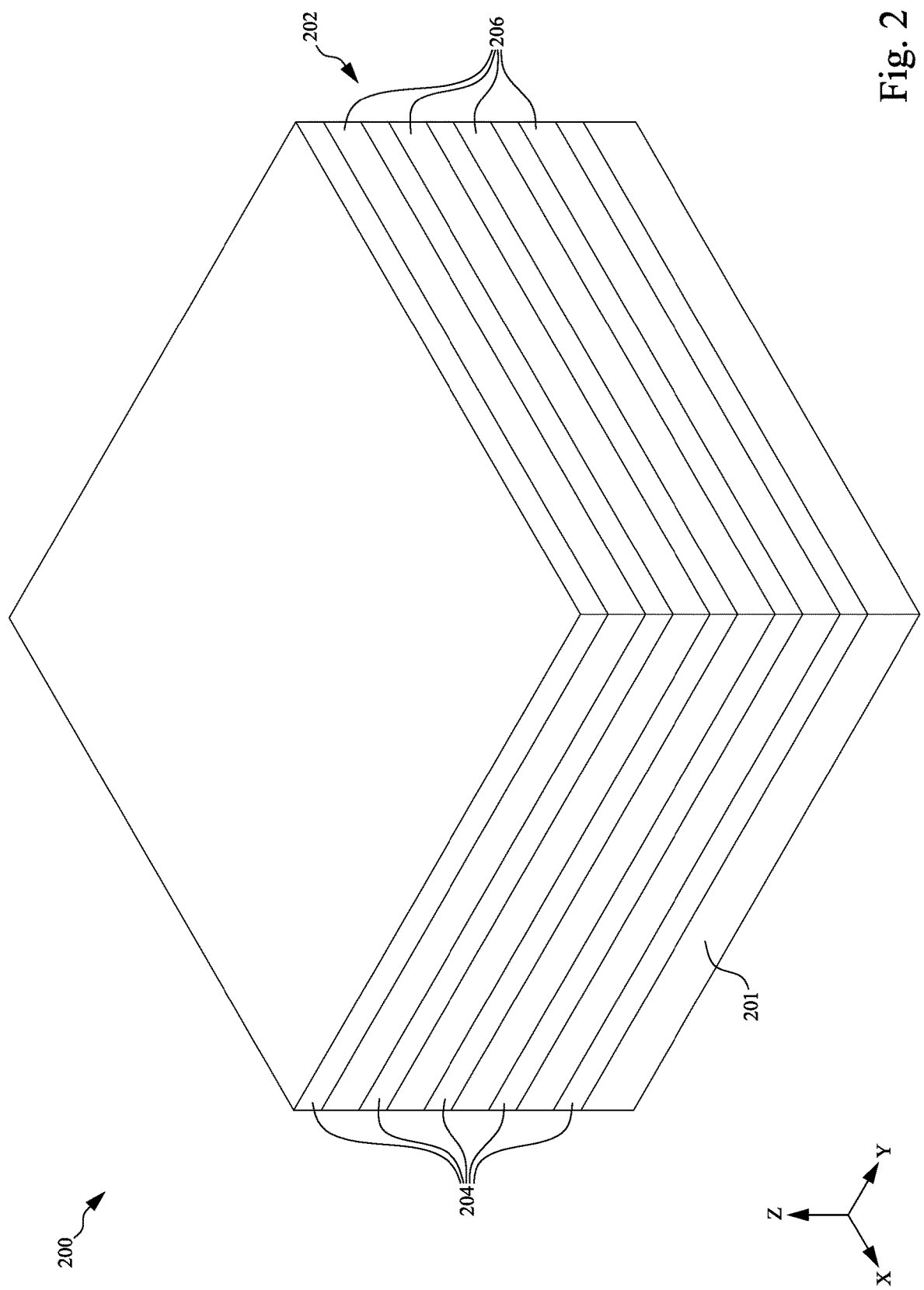
FIGS. 2, 3, 4, 5, 6, 7, 8, 9, 10, 11A, and 11B each illustrate a perspective or top view of an example three-dimensional memory device during various fabrication stages, made by the method of FIG. 1, in accordance with some embodiments.

Corresponding to operation 102 of FIG. 1, FIG. 2 is a perspective view of the 3D memory device 200 including a stack 202 formed over a semiconductor substrate 201 at one of the various stages of fabrication, in accordance with various embodiments.

The substrate 201 may be a semiconductor substrate, such as a bulk semiconductor, a semiconductor-on-insulator (SOI) substrate, or the like, which may be doped (e.g., with a p-type or an n-type dopant) or undoped. The substrate 201 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 201 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other materials are within the scope of the present disclosure.

The stack 202 includes a number of insulating layers 204 and a number of sacrificial layers 206 alternately stacked on top of one another over the substrate 201 along a vertical direction (e.g., the Z direction). Although five insulating layers 204 and four sacrificial layers 206 are shown in the illustrated embodiment of FIG. 2, it should be understood that the stack 202 can include any number of insulating layers and any number of sacrificial layers alternately disposed on top of one another, while remaining within the scope of the present disclosure. Further, although the stack 202 directly contacts the substrate 201 in the illustrated embodiment of FIG. 2, it should be understood that the stack 202 is separated from the substrate 201 (as mentioned above). For example, a number of (planar and/or non-planar) transistors may be formed over the substrate 201, and a number of metallization layers, each of which includes a number of contacts electrically connecting to those transistors, may be formed between the substrate 201 and the stack 202. As used herein, the alternately stacked insulating layers 204 and sacrificial layers 206 refer to each of the sacrificial layers 206 being adjoined by two adjacent insulating layers 204. The insulating layers 204 may have the same thickness thereamongst, or may have different thicknesses. The sacrificial layers 206 may have the same thickness thereamongst, or may have different thicknesses. In some embodiments, the stack 202 may begin with the insulating layer 204 (as shown in FIG. 2) or the sacrificial layer 206.

The insulating layers 204 can include at least one insulating material. The insulating materials that can be employed for the insulating layer 204 include, but are not limited to, silicon oxide (including doped or undoped silicate glass), silicon nitride, silicon oxynitride, organosilicate glass (OSG), spin-on dielectric materials, dielectric metal oxides that are generally known as high dielectric constant (high-k) dielectric oxides (e.g., aluminum oxide, hafnium oxide, etc.) and silicates thereof, dielectric metal oxynitrides and silicates thereof, and organic insulating materials. Other materials are within the scope of the present disclosure. In one embodiment, the insulating layers 204 can be silicon oxide.

The sacrificial layers 206 may include an insulating material, a semiconductor material, or a conductive material. The material of the sacrificial layers 206 is a sacrificial material that can be subsequently removed selective to the material of the insulating layers 204. Non-limiting examples of the sacrificial layers 206 include silicon nitride, an amorphous semiconductor material (such as amorphous silicon), and a polycrystalline semiconductor material (such as polysilicon). In one embodiment, the sacrificial layers 206 can be spacer material layers that include silicon nitride or a semiconductor material including at least one of silicon or germanium. Other materials are within the scope of the present disclosure.

The stack 202 can be formed by alternately depositing the respective materials of the insulating layers 204 and sacrificial layers 206 over the substrate 201. In some embodiments, one of the insulating layers 204 can be deposited, for example, by chemical vapor deposition (CVD), followed by depositing, for example, using CVD or atomic layer deposition (ALD), one of the sacrificial layers 206. Other methods of forming the stack 202 are within the scope of the present disclosure.

Figure 3:
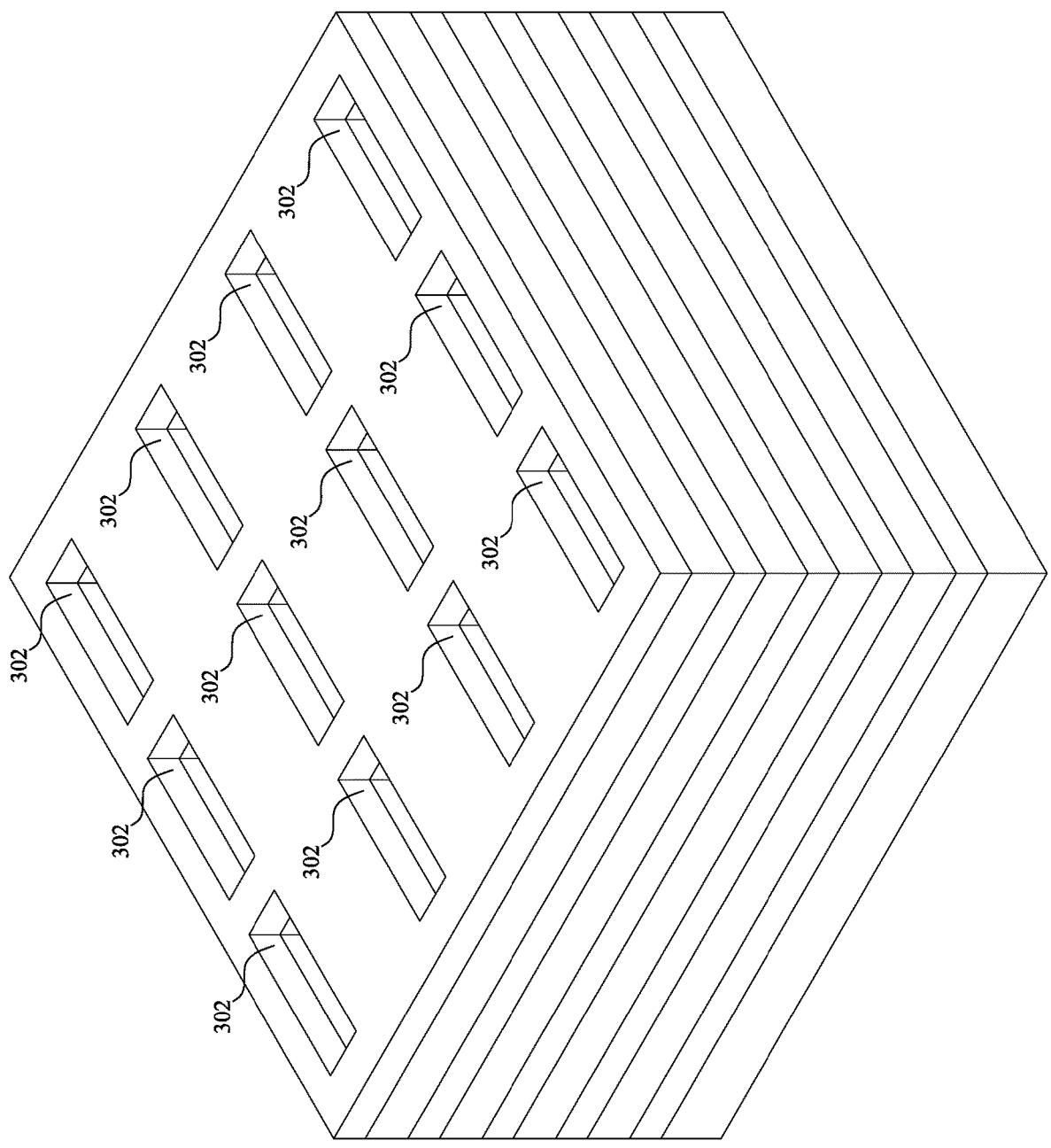

Corresponding to operation 104 of FIG. 1, FIG. 3 is a perspective view of the 3D memory device 200 in which the stack 202 is patterned to form a number of first trenches 302 at one of the various stages of fabrication, in accordance with various embodiments. Although twelve first trenches 302 are shown in the illustrated embodiment of FIG. 3, it should be understood that the 3D memory device 200 can include any number of first trenches 302, while remaining within the scope of the present disclosure.

The first trenches 302 all extend along a lateral direction (e.g., the X direction). The first trenches 302 can be formed by using a first etching process. The first etching process may include, for example, a reactive ion etch (RIE) process, a neutral beam etch (NBE) process, the like, or combinations thereof. The first etching process may be anisotropic. As such, the first trenches 302, vertically extending through the stack 202, can be formed. For example, the first trenches 302 (after the first etching process) may have nearly vertical sidewalls, each of which is collectively constituted by respective etched sidewalls of the insulating layers 204 and sacrificial layers 206. Other methods of forming the first trenches 302 are within the scope of the present disclosure.

Each of the first trenches may define initial footprints of a number of memory strings, which will be discussed in further detail below. In some embodiments, the first trenches 302 may be strips (when viewed from the top) arranged in an array of rows and columns, such that the columns of the first trenches 302 are parallel to each other (e.g., spaced from each other in the Y direction), and the rows of the first trenches 302 are parallel to each other (e.g., spaced from each other in the X direction). In some embodiments, the first trenches 302 are closely spaced with respect to each other (by the remaining portions of the stack 202).

Figure 4:
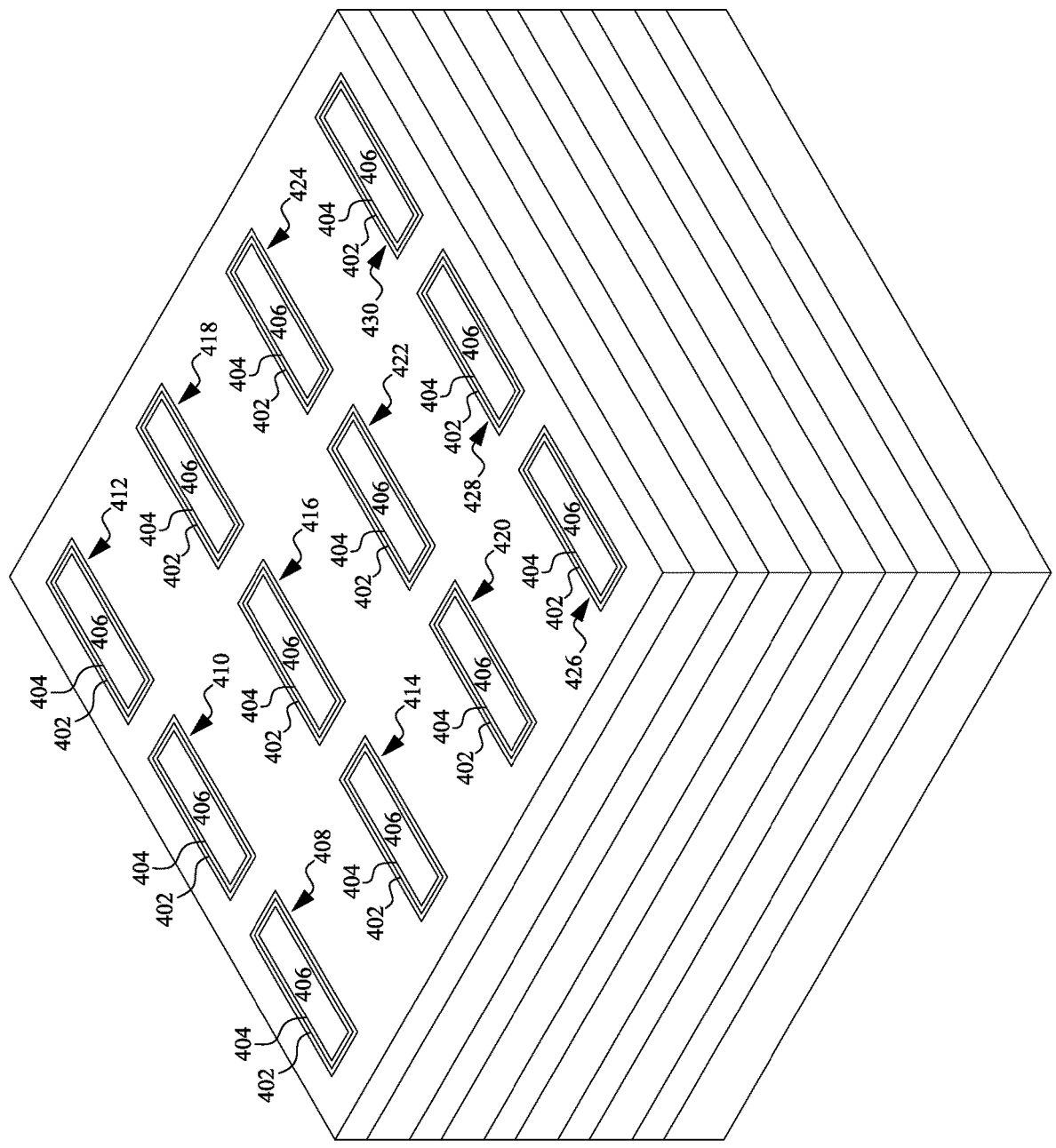

Corresponding to operation 106 of FIG. 1, FIG. 4 is a perspective view of the 3D memory device 200 including a ferroelectric layer 402 and a channel layer 404 in each of the first trenches 302 at one of the various stages of fabrication, in accordance with various embodiments. In various embodiments, each of the ferroelectric layers 402 includes four portions, each of which is formed to extend along one of the sidewalls of a corresponding trench. Accordingly, in such embodiments, each of the ferroelectric layers 402 surrounds (e.g., wraps around) a corresponding memory string. Over each ferroelectric layer, a channel layer also includes four portions that are in contact with the four portion of that ferroelectric layer 402, respectively.

The ferroelectric layer 402 includes a ferroelectric material. As used herein, a "ferroelectric material" refers to a material that displays a spontaneous electric polarization even when there is no applied electric field and that has the polarization that can be reversed by the application of an external electric field.

In one embodiment, the ferroelectric material includes an orthorhombic metal oxide of which a unit cell has a non-zero permanent electric dipole moment. In one embodiment, the orthorhombic metal oxide includes an orthorhombic hafnium doped zirconium oxide or an orthorhombic hafnium oxide doped with a dopant having an atomic radius that is between 40% smaller than to 15% larger than the atomic radium of hafnium. Other ranges of atomic radii dopant atoms are within the scope of the present disclosure. For example, the orthorhombic metal oxide can include an orthorhombic phase hafnium oxide doped with at least one of silicon, aluminum, yttrium, gadolinium and zirconium. Other materials are within the scope of the present disclosure. The atomic concentration of the dopant atoms (e.g., aluminum atoms) can be in a range from 0.5% to 16.6%. In one embodiment, the atomic concentration of the dopant atoms can be greater than 1.0%, 2.0%, 3.0%, 5.0%, 7.5%, and/or 10%. Alternatively or additionally, the atomic concentration of the dopant atoms can be less than 15%, 12.5%, 10%, 7.5%, 5.0%. 3.0%, and/or 2.0%. Other values and ranges of atomic concentration dopant atoms are within the scope of the present disclosure.

The orthorhombic phase of the orthorhombic metal oxide can be a doping-induced non-centrosymmetric crystalline phase that generates a remanent dipole moment upon application and removal of an external electric field. Specifically, polarization of the oxygen atoms with respect to the metal atoms in the orthorhombic metal oxide can induce non-centrosymmetric charge distribution due to the positions (e.g., up or down positions) of the oxygen atoms in the orthorhombic lattice. Other orthorhombic phases are within the scope of the present disclosure.

The ferroelectric material (of the ferroelectric layer 402) can be deposited over the workpiece as a continuous liner structure, for example, by a conformal deposition method such as atomic layer deposition (ALD) or chemical vapor deposition (CVD). For example, a metal-organic precursor gas and oxygen gas can be alternately or simultaneously flowed into a processing chamber to deposit the ferroelectric material. Other methods of depositing the ferroelectric layer 402 are within the scope of the present disclosure. The deposited material of the ferroelectric material can be annealed at an elevated temperature that induces formation of the orthorhombic phase in the ferroelectric material. As a non-limiting example, temperature for formation of the orthorhombic metal oxide material in the ferroelectric material can be in a range from 450 degrees Celsius to 850 degrees Celsius, and typically has a window of about 200 degrees Celsius that depends on the composition of the metal oxide. Other temperature values and ranges for depositing the ferroelectric material are within the scope of the present disclosure. After deposition, the ferroelectric material can be annealed at a temperature of 500 to 850 degrees Celsius, such as 500 to 700, such as 550 to 600 degrees Celsius to increase the amount of the orthorhombic phase in the ferroelectric material. Other temperature values and ranges for annealing the ferroelectric material are within the scope of the present disclosure.

The average thickness of the ferroelectric material can be in a range from 5 nm to 30 nm, such as from 6 nm to 12 nm, although lesser and greater average thicknesses can also be employed. Other ranges of average thickness are within the scope of the present disclosure. As used herein, a "thickness" refers to the average thickness unless indicated otherwise. The ferroelectric material can have a thickness variation that is less than 30% from an average thickness. In one embodiment, the thickness variation of the ferroelectric material can be less than 20%, less than 10%, and/or less than 5% of the average thickness of the ferroelectric material. Other ranges of thickness variation are within the scope of the present disclosure.

The channel layer 404 includes a semiconductor material such as at least one elemental semiconductor material, at least one III-V compound semiconductor material, at least one II-VI compound semiconductor material, at least one organic semiconductor material, or other semiconductor materials. In one embodiment, the semiconductor material includes amorphous silicon or polysilicon. Other materials are within the scope of the present disclosure. In one embodiment, the semiconductor material can have a doping of the first conductivity type. Other conductivity types are within the scope of the present disclosure.

The semiconductor material (of the channel layer 404) can be formed over the workpiece as a continuous liner structure, for example, by a conformal deposition method such as low pressure chemical vapor deposition (LPCVD). Other methods of forming the semiconductor material are within the scope of the present disclosure. The thickness of the semiconductor material can be in a range from 3 nm to 30 nm, although lesser and greater thicknesses can also be employed. Other ranges of thickness are within the scope of the present disclosure. In one embodiment, the semiconductor material can have a doping of the first conductivity type. Other conductivity types are within the scope of the present disclosure.

To form the ferroelectric layer 402 and the channel layer 404 (as shown in FIG. 4), the above-mentioned ferroelectric material and semiconductor material may be sequentially formed over the workpiece. Each of the ferroelectric material and semiconductor material may be formed as a continuous liner structure over the workpiece. In various embodiments, the first trenches 302 cannot be completely filled by the ferroelectric material and semiconductor material. Next, an anisotropic etching process may be performed to pattern or otherwise separate the continuous ferroelectric material and semiconductor material. Other methods of patterning are within the scope of the present disclosure. Further, a dielectric fill material 406 can be deposited over the workpiece to fill any unfilled volume within the first trenches 302. The dielectric fill material 406 includes a dielectric material such as, for example, silicon oxide, organosilicate glass, an otherwise low-k dielectric material, or combinations thereof. Other materials are within the scope of the present disclosure. The dielectric fill material 406 can be deposited by a conformal deposition method such as low pressure chemical vapor deposition (LPCVD), or by a self-planarizing deposition process such as spin coating. Other methods of depositing the dielectric fill material 406 are within the scope of the present disclosure. Following the deposition of the dielectric fill material 406, a CMP process may be performed to remove any excess dielectric fill material. Other methods of removing excess dielectric fill material are within the scope of the present disclosure.

Upon depositing the ferroelectric layer 402 and the channel layer 404 in the first trenches 302, a number of memory strings can be formed (or isolated). For example in FIG. 4, a memory string 408 can be formed by the ferroelectric layer 402 and the channel layer 404. The first memory string 1302 includes four memory cells vertically disposed at four different tiers, which are to be controlled (e.g., gated) by respective WLs formed in later stages. Similarly, a number of memory strings (e.g., 410, 412, 414, 416, 418, 420, 422, 424, 426, 428, and 430) can each be formed by the ferroelectric layer 402 and the channel layer 404. Further, each memory cell includes a region (or portion) of the vertically extending the ferroelectric layer 402 and a region (or portion) of the vertically extending the channel layer 404. Although four different tiers are shown in the illustrated embodiment of FIG. 4, it should be understood that the 3D memory device 200 can include any number of tiers, while remaining within the scope of the present disclosure.

Figure 5:
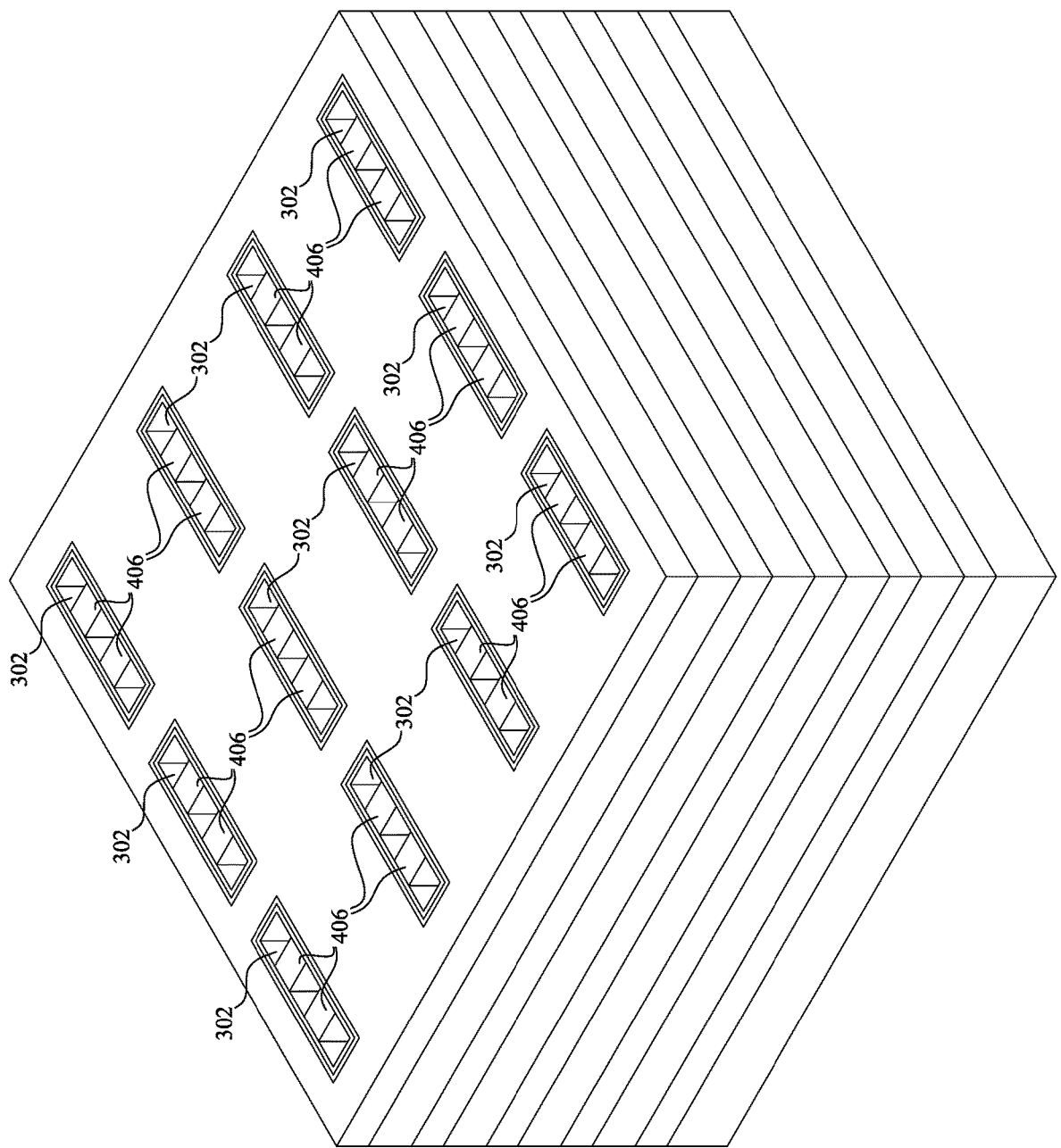

Corresponding to operation 108 of FIG. 1, FIG. 5 is a perspective view of the 3D memory device 200 in which the dielectric fill material 406 in each of the first trenches 302 is patterned at one of the various stages of fabrication, in accordance with various embodiments.

The dielectric fill material 406 may be patterned to define initial footprints of a number of bit lines (BLs) and source lines (SLs), which will be discussed in further detail below. As shown in FIG. 5, in the first trenches 302, the dielectric fill material 406 is patterned (or otherwise separated) by, for example, an anisotropic etching process to form various trench portions of the first trenches 302. Other methods of forming various trench portions are within the scope of the present disclosure.

Alternatively stated, in each of the trenches, the trench portions are separated from one another by various remaining portions of the dielectric fill material 406. Such a remaining portion of the dielectric fill material 406 can be configured to electrically isolate a first bit line (BL), a second BL, and source line (SL) of each memory cell of a certain string of the memory device 200 from each other, which will be discussed in further detail below.

Figure 6:
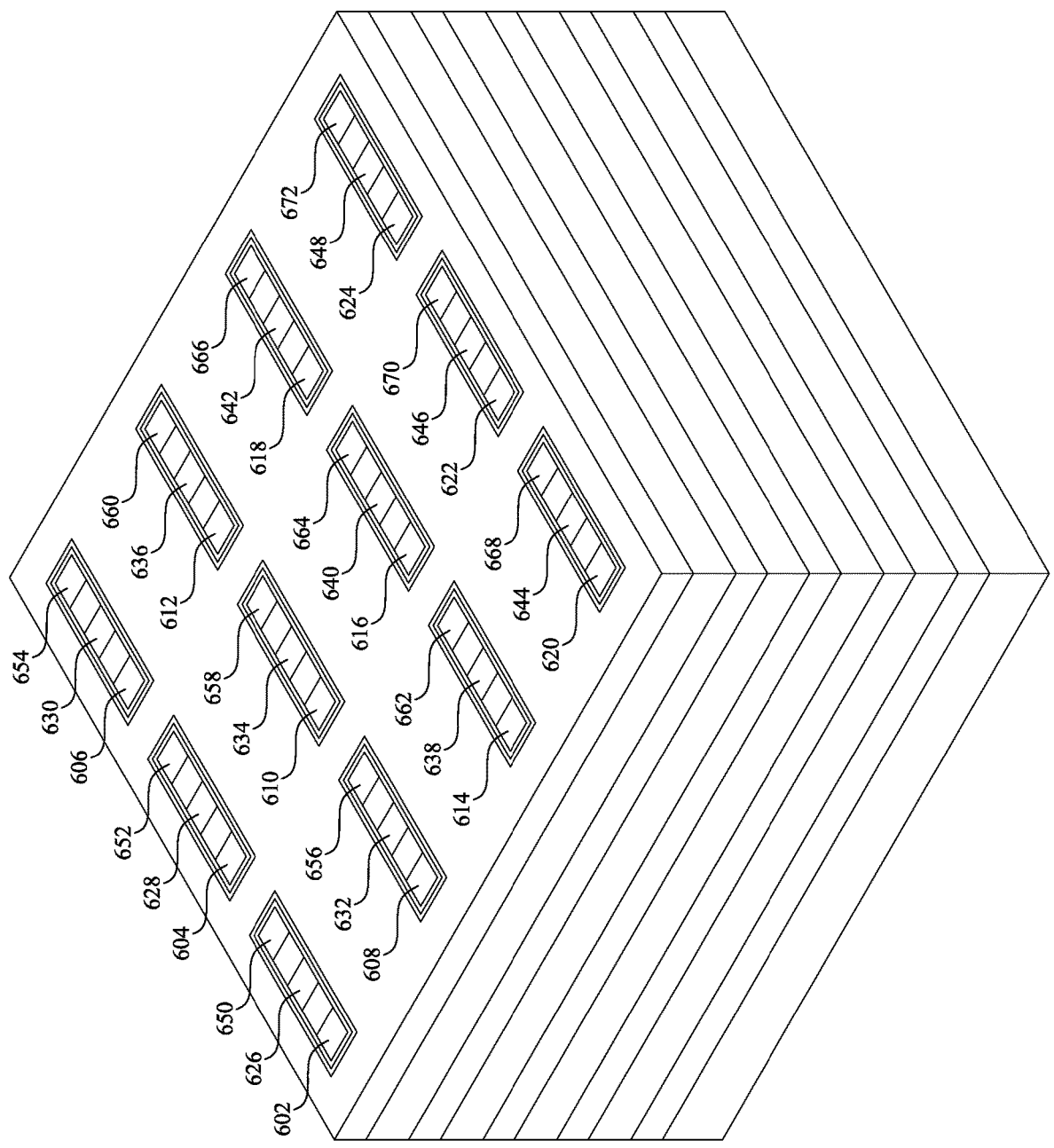

Corresponding to operation 110 of FIG. 1, FIG. 6 is a perspective view of the 3D memory device 200 including a number of first BLs, 602, 604, 606, 608, 610, 612, 614, 616, 618, 620, 622, and 624, a number of SLs, 626, 628, 630, 632, 634, 636, 638, 640, 642, 644, 646, and 648, and a number of second BLs 650, 652, 654, 656, 658, 660, 662, 664, 666, 668, 670, and 672, at one of the various stages of fabrication, in accordance with various embodiments.

The first BLs 602 through 624, SLs 626 through 648, and second BLs 650 through 672 (collectively, drain/source layers) can be formed by filling the trench portions of the first trenches 302 with a metal material. The metal material can be selected from the group comprising tungsten, copper, cobalt, ruthenium, titanium, tantalum, or combinations thereof. Other materials are within the scope of the present disclosure. The metal material can be deposited by a conformal deposition method, which can be, for example, chemical vapor deposition (CVD), atomic layer deposition (ALD), electroless plating, electroplating, or a combination thereof. Other methods of depositing the metal material are within the scope of the present disclosure.

Figure 7:
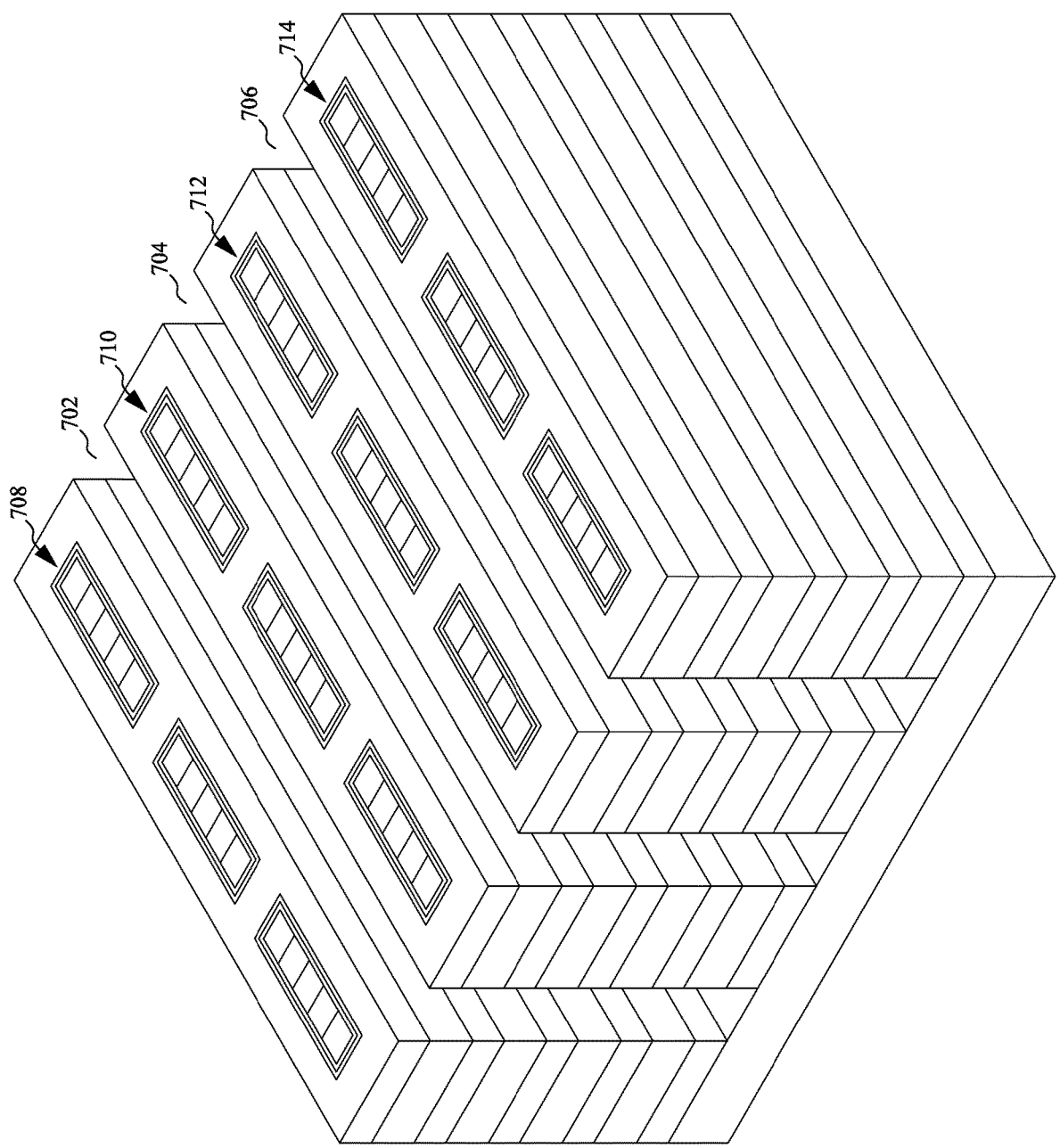

Corresponding to operation 112 of FIG. 1, FIG. 7 is a perspective view of the 3D memory device 200 in which the stack 202 is patterned to form a number of second trenches, 702, 704, and 706, at one of the various stages of fabrication, in accordance with various embodiments. Although three second trenches 702-706 are shown in the illustrated embodiment of FIG. 7, it should be understood that the 3D memory device 200 can include any number of second trenches, while remaining within the scope of the present disclosure. The second trenches 702-706 all extend along a lateral direction (e.g., the X direction). The second trenches 702-706 can be formed by performing a similar process as the process used to form the first trenches 302.

As a result of forming the second trenches 702-706, fin-like structures 708, 710, 712, and 714 are formed. As shown, the fin-like structures 708 to 714 (sometimes referred to as stripe structures) all extend along a lateral direction (e.g., the X direction), and are in parallel with one another. Each of the fin-like structures 708 to 714 includes a number of layers (or tiers) alternately stacked on top of one another. In particular, each fin-like structure includes an alternate stack of a number of (remaining portions of) the insulating layers 204 and a number of (remaining portions of) the sacrificial layers 206. Each of the fin-like structures 708 to 714 include one or more memory strings. For example, the fin-like structure 708 includes the memory strings 408 to 412.

Figure 8:
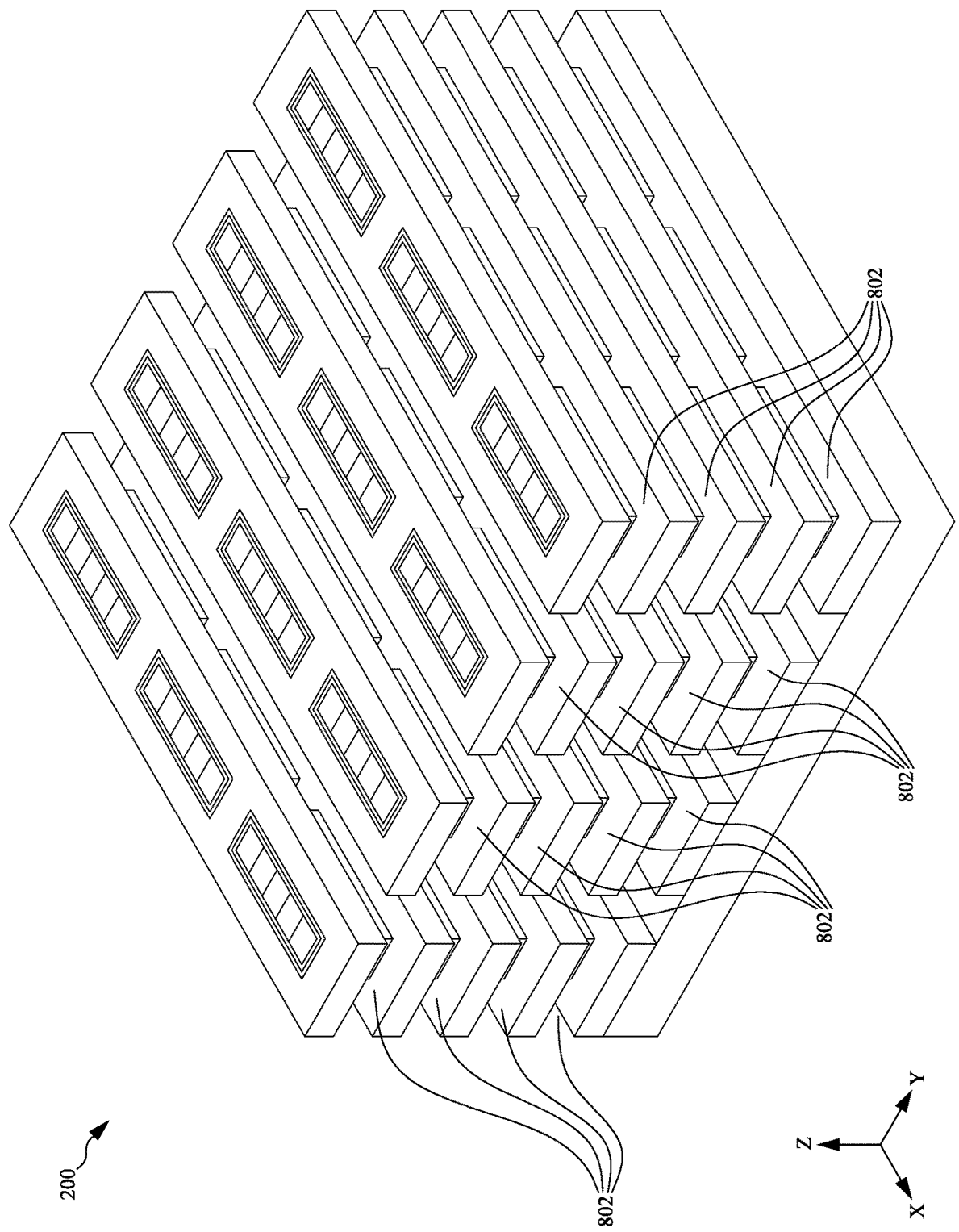

Corresponding to operation 114 of FIG. 1, FIG. 8 is a perspective view of the 3D memory device 200 in which the sacrificial layers 206 are etched, in accordance with various embodiments. Each of the sacrificial layers 206 may be recessed (e.g., removed) laterally (e.g., along the Y direction) to generate recesses 802 in the fin-like structures 708 to 714, in place of the sacrificial layers 206. The sacrificial layers 206 can be recessed by performing a second etching process that etches the sacrificial layers 206 selective to the insulating layers 204 through the second trenches 702-706. Alternatively stated, the insulating layers 204 may remain substantially intact throughout the second etching process. As such, the second trenches 702-706 (after the second etching process) can each include its inner sidewalls present in a step-like profile. Other methods of recessing the sacrificial layers 206 are within the scope of the present disclosure.

The second etching process can include a wet etching process employing a wet etch solution, or can be a gas phase (dry) etching process in which the etchant is introduced in a vapor phase into the first trenches (dotted lines). In the example where the sacrificial layers 206 include silicon nitride and the insulating layers 204 include silicon oxide, the second etching process can include a wet etching process in which the workpiece is immersed within a wet etch tank that includes phosphoric acid, which etches silicon nitride of the sacrificial layer 206 selective to silicon oxide, silicon, and various other materials of the insulating layers 204. Other methods of etching the sacrificial layer 206 are within the scope of the present disclosure.

Figure 9:
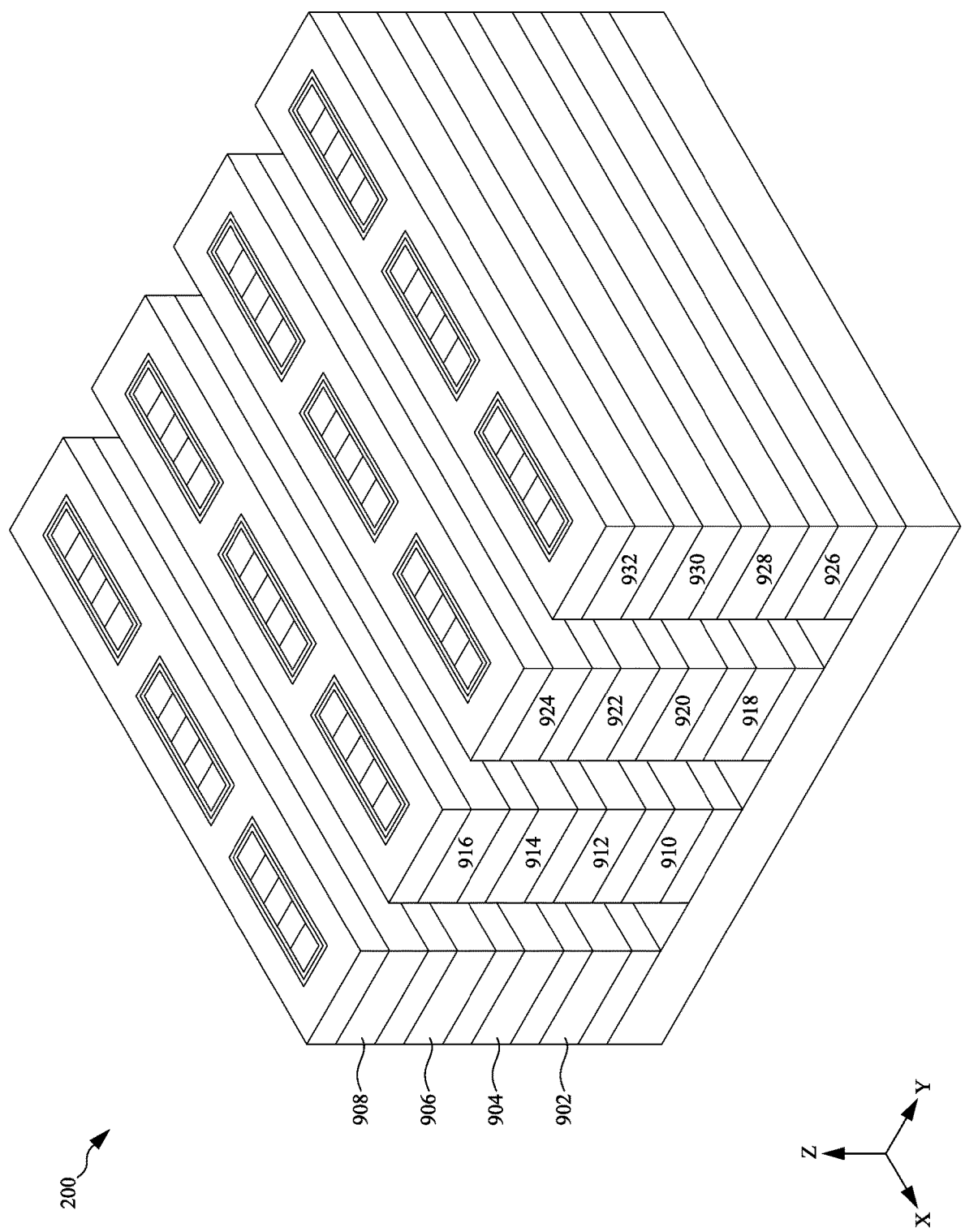

Corresponding to operation 116 of FIG. 1, FIG. 9 is a perspective view of the 3D memory device 200 in which a number of word lines (WLs), 902, 904, 906, 908, 910, 912, 914, 916, 918, 920, 922, 924, 926, 928, 930, and 932, are formed at one of the various stages of fabrication, in accordance with various embodiments. Each WL is coupled to a number of memory cells disposed along a certain trench in each tier. For example, WL 902 may be formed in the first tier of the fin-like structure 708.

The WLs 902-932 can be formed by filling recesses 802 with a metallic fill layer. The metallic fill layer includes at least one metal material selected from the group comprising tungsten, copper, cobalt, ruthenium, titanium, tantalum, or combinations thereof. Other materials are within the scope of the present disclosure. The metallic fill layer can be deposited by a conformal deposition method, which can be, for example, chemical vapor deposition (CVD), atomic layer deposition (ALD), electroless plating, electroplating, or a combination thereof. Other methods of depositing the metallic fill layer are within the scope of the present disclosure.

Upon forming WLs 902-932, each memory cell of the memory strings 408 through 430 can be accessed through its respective WL, BL, and SL. For example, the memory cell of the 3D memory device 200 can be written (i.e., programmed or erased), and a ferroelectric state of the memory cell can be read (i.e., sensed) in the following manner. Each memory cell can include a region (or portion) of one of the vertically extending ferroelectric layers 402 located between a selected one of the WLs (e.g., 902-932, as shown in FIG. 9) and a selected one of the vertically extending channel layers 404. In the following discussion, the memory cell along the memory string 408 at the fourth tier (hereinafter "memory cell 408A") is selected as a representative example for being written and read.

In case the channel layer 404 include a p-doped semiconductor material, and the minority charge carriers in the p-doped semiconductor channel are electrons, the selected memory cell 408A can be programmed into a programmed (i.e., ON) state that locally decreases a threshold voltage inside the selected channel layer 404 and at a level of the selected WL 908 by applying: (1) a current flow bias voltage across the first BL 602 (or the second BL 650) and the SL 626 located within the selected channel layer 404; (2) a selected word line voltage to the selected WL 908, wherein the selected word line voltage is a greater positive voltage with respect to voltages applied to the first BL 602 and the SL 626; and (3) an unselected word line voltage that is less positive than the selected word line voltage to each of the unselected WLs (e.g., 902, 904, and 906). In a non-limiting example, the SL 626 can be biased at 0 V, the first BL 602 can be biased at 2.0 V, the selected WL 908 can be biased at 5 V, and the unselected WLs can be biased at 2.5 V. Other bias voltage values are within the scope of the present disclosure. This programming step sets the channel threshold voltage adjacent to the programmed memory cell 408A (i.e., adjacent to the selected WL 908) to a relatively low value, such as 0 V. Other threshold voltage values are within the scope of the present disclosure.

Continuing with the same example, the selected memory cell 408A can be programmed into an erased (i.e., OFF) state that increases a threshold voltage inside the selected channel layer 404 and at a level of the selected WL 908 by applying: (1) a current flow bias voltage across the first BL 602 (or the second BL 650) and the SL 626 located within the selected channel layer 404; (2) a selected word line voltage to the selected WL 908, wherein the selected word line voltage is a negative voltage with respect to at least one of voltages applied to the first BL 602 and the SL 626; and (3) an unselected word line voltage to unselected WLs (e.g., 902, 904, and 906) that is more positive than the voltages applied to the first BL 602 and the SL 626. In a non-limiting example, the SL 626 can be biased at 5 V, the first BL 602 can be biased at 5 V, the selected WL 908 can be biased at 0 V, and the unselected WLs can be biased at 7.5 V. Other bias voltage values are within the scope of the present disclosure. This erasing step sets the channel threshold voltage adjacent to the programmed memory cell 408A (i.e., adjacent to the selected WL 908) to a relatively higher value, such as 1 V, which is higher than in the programmed. Other threshold voltage values are within the scope of the present disclosure.

The ON or OFF state of the selected memory cell 408A can be read by applying: (1) a current flow bias voltage across the first BL 602 (or the second BL 650) and the SL 626; (2) a selected word line voltage to the selected WL 908, wherein the selected word line voltage is at one of, or is between, voltages applied to the first BL 602 and the SL 626; and (3) an unselected word line voltage applied to the unselected WLs that is more positive than the voltages applied to the selected WL 908, the first BL 602, and the SL 626. In a non-limiting example, the SL 626 can be biased at 0 V, the first BL 602 can be biased at 1 to 2 V, the WL 908 can be biased at 1 to 1.5 V, and the unselected WLs can be biased at 2.5 V (one half of the programming voltage applied to the selected WL 908). Other bias voltage values are within the scope of the present disclosure. This provides a voltage between the first BL 602 and the SL 626 that is greater than the threshold voltage of the channel in the erased memory cells to keep the current flowing in the channel between the first BL 602 and the SL 626.

Figure 10:
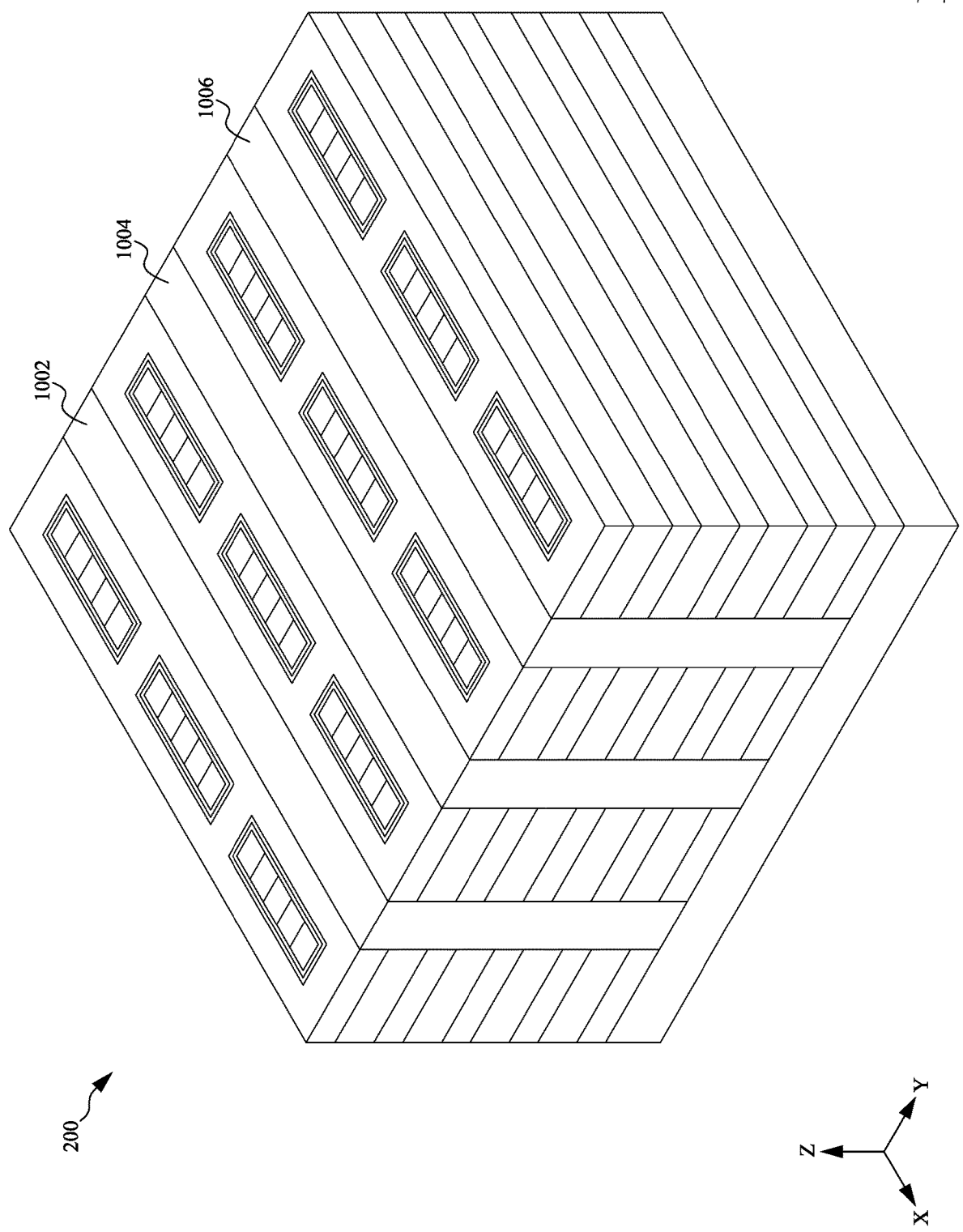

Corresponding to operation 118 of FIG. 1, FIG. 10 is a perspective view of the 3D memory device 200 in which insulating fill layers 1002, 1004, and 1006 are deposited in the second trenches 702-706 at one of the various stages of fabrication, in accordance with various embodiments. The insulating fill layers 1002-1006 may include an insulating material similar as the insulating layers 204.

Figure 11A:
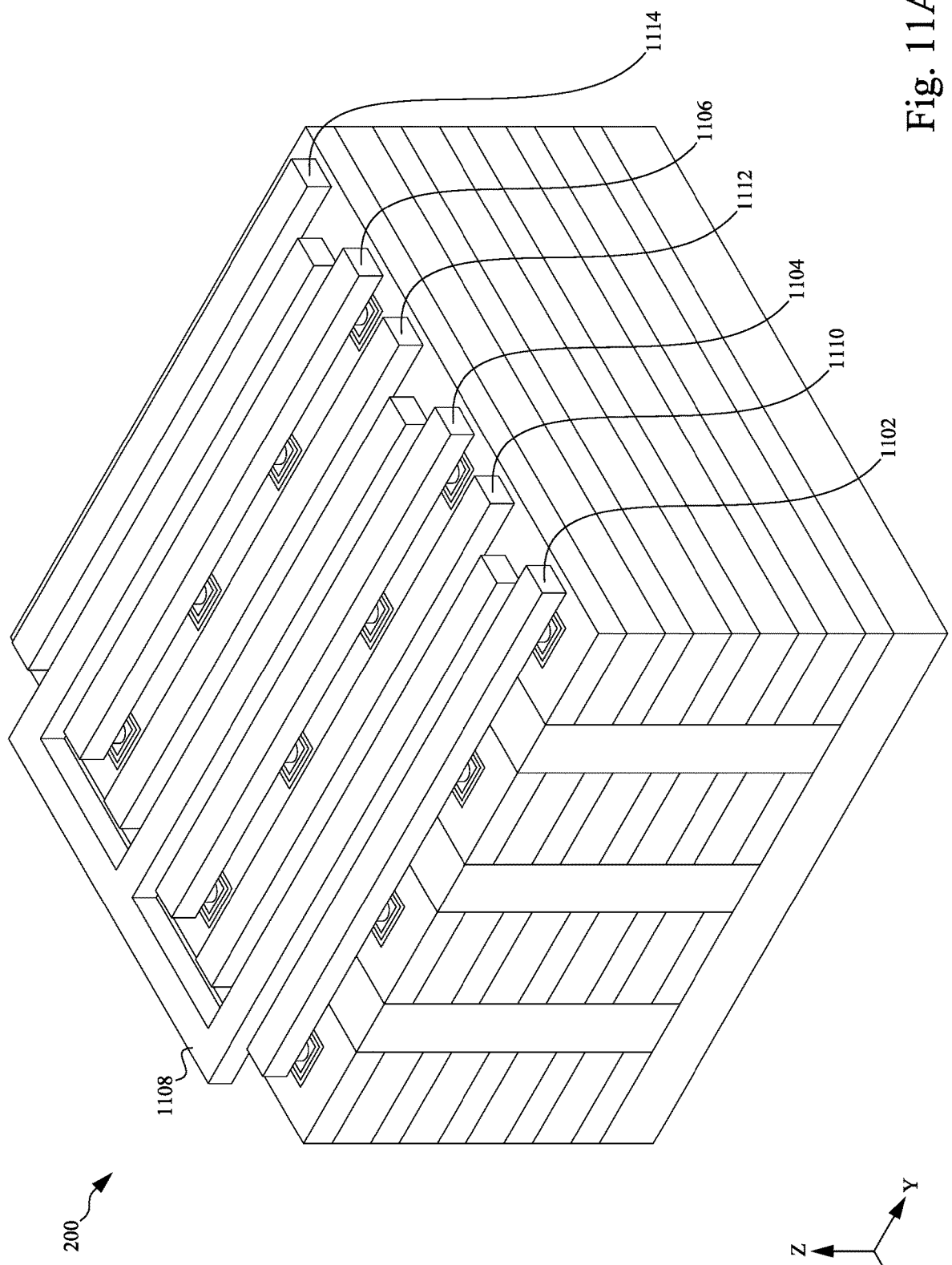
Figure 11B:
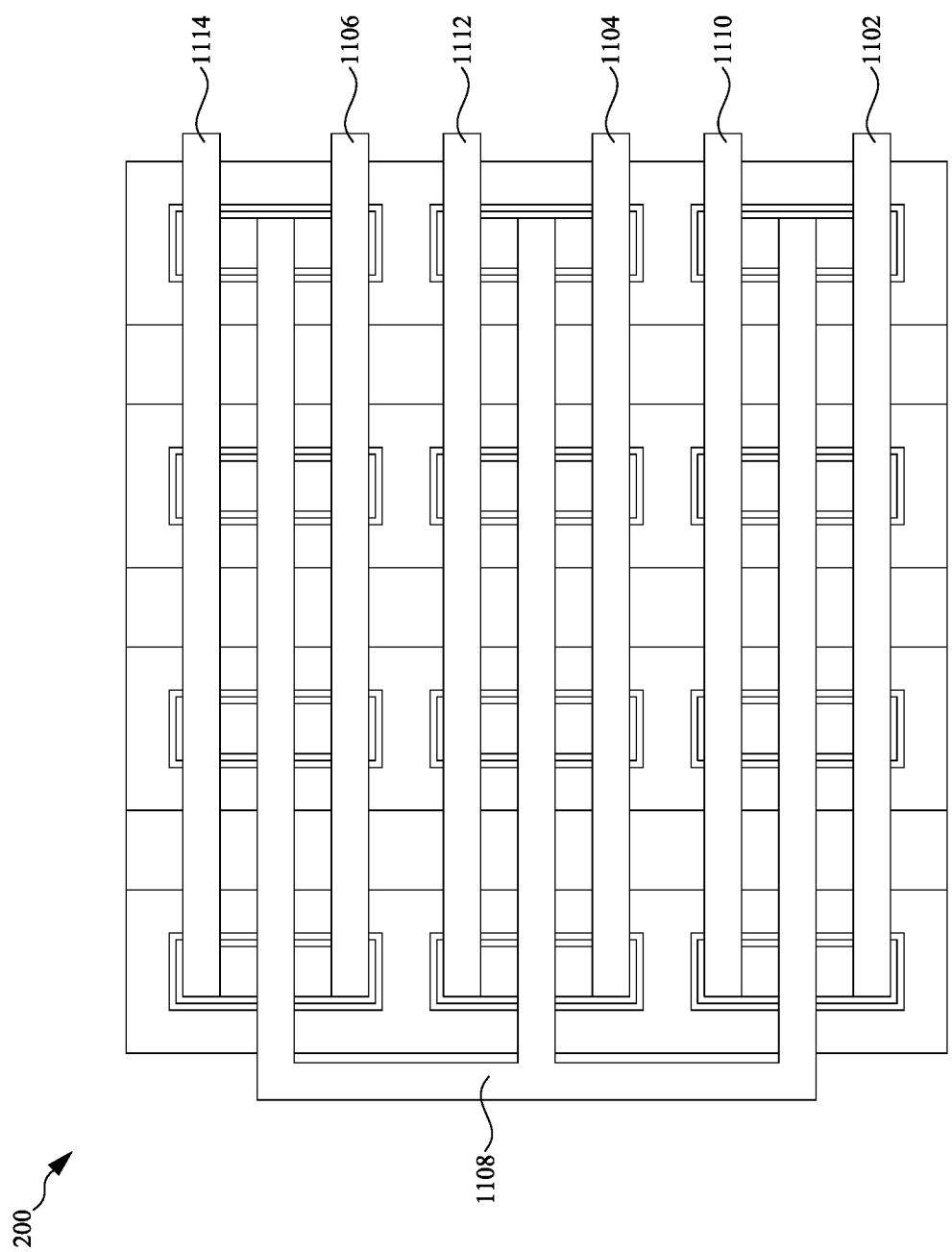

Corresponding to operation 120 of FIG. 1, FIG. 11A is a perspective view of the 3D memory device 200 in which metallization layers 1102-1114 are formed at one of the various stages of fabrication, in accordance with various embodiments. Further, FIG. 11B is a top view of the 3D memory device 200, corresponding to FIG. 11A. In some embodiments, the metallization layers 1102-1106 are formed over the first BLs 602-624, the metallization layer 1108 is formed over the SLs 626-648, and the metallization layers 1110-1114 are formed over the second BLs 650-672. For example, the metallization layer 1102 is formed over the first BL 602, the metallization layer 1104 is formed over the first BL 604, the metallization layer 1106 is formed over the first BL 606, the metallization layer 1108 is formed over the SLs 626, 628, and 630, the metallization layer 1110 is formed over the second BL 650, the metallization layer 1112 is formed over the second BL 652, and the metallization layer 1114 is formed over the second BL 654.

In various embodiments, the 3D memory device 200 may be formed during a back-end-of-line (BEOL) process. For example, the 3D memory device 200 may be formed across the multiple metallization layers 1102-1114 that are formed above a number of transistors over a substrate (which is typically referred to as a front-end-of-line (FEOL) process). Thus, it should be understood the 3D memory device 200, as hereinafter illustrated, is simplified and thus, may include a number of various other devices (not shown in the following figures) such as peripheral transistors, staircase WLs, etc., while remaining within the scope of the present disclosure.

Figure 12:
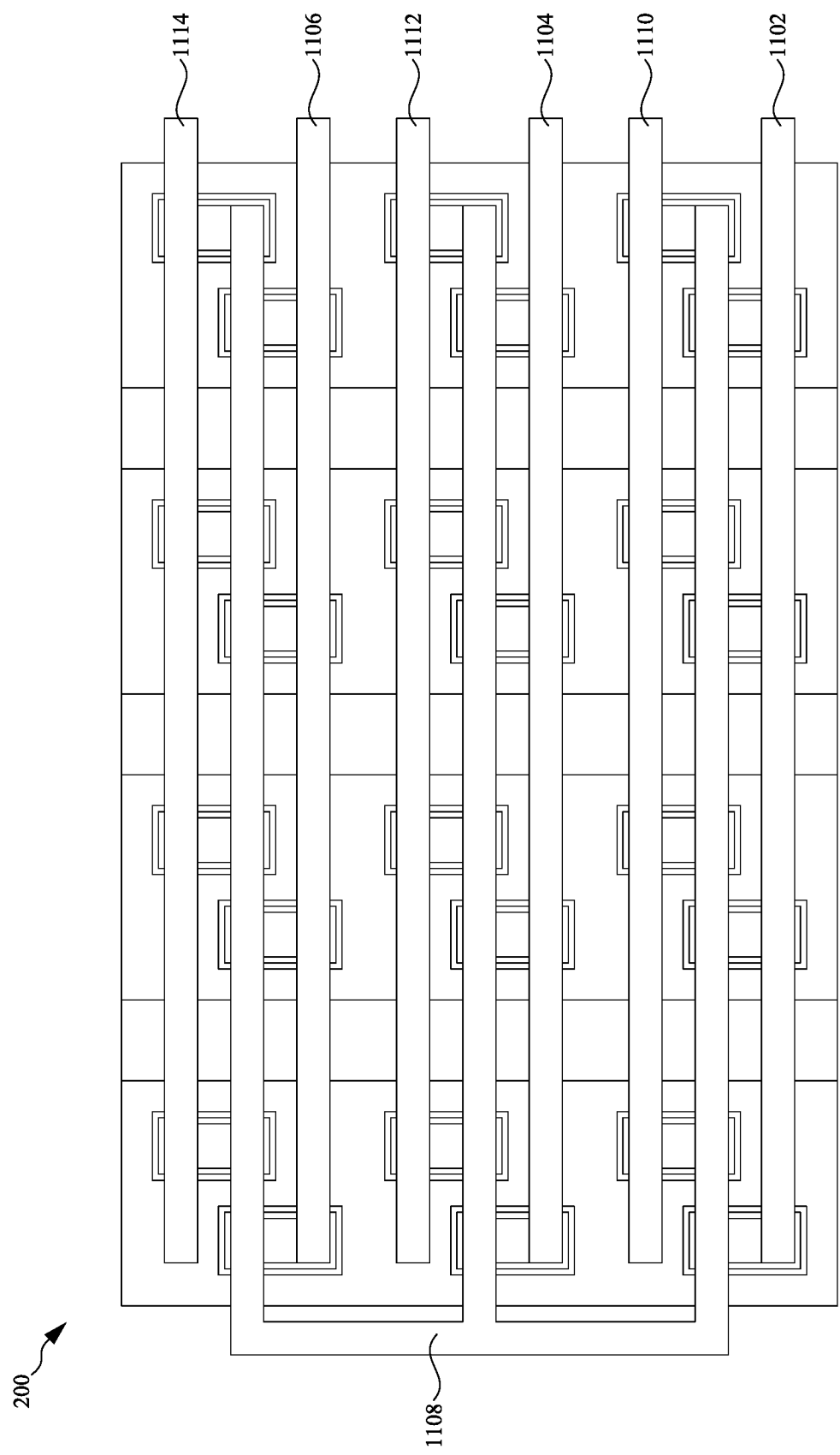
FIG. 12 illustrates a top view of an example three-dimensional memory device, made by the method of FIG. 1, in accordance with some embodiments.

FIG. 12 is a top view of the 3D memory device 1200. The 3D memory device 1200 is similar to the 3D memory device 200 except that the memory device 1200 includes second memory strings adjacent to the memory strings in the X direction and offset in the Y direction. For example, in a first fin-like structure, a second memory string is adjacent to the memory string 408 in the X direction and offset in the Y direction. Each tier of the memory strings (e.g., the memory strings 408, 410, and 412) and their adjacent second memory strings are surrounded by a respective WL. Each memory string of the 3D memory device 1200 has one BL and one SL.

Figure 13:
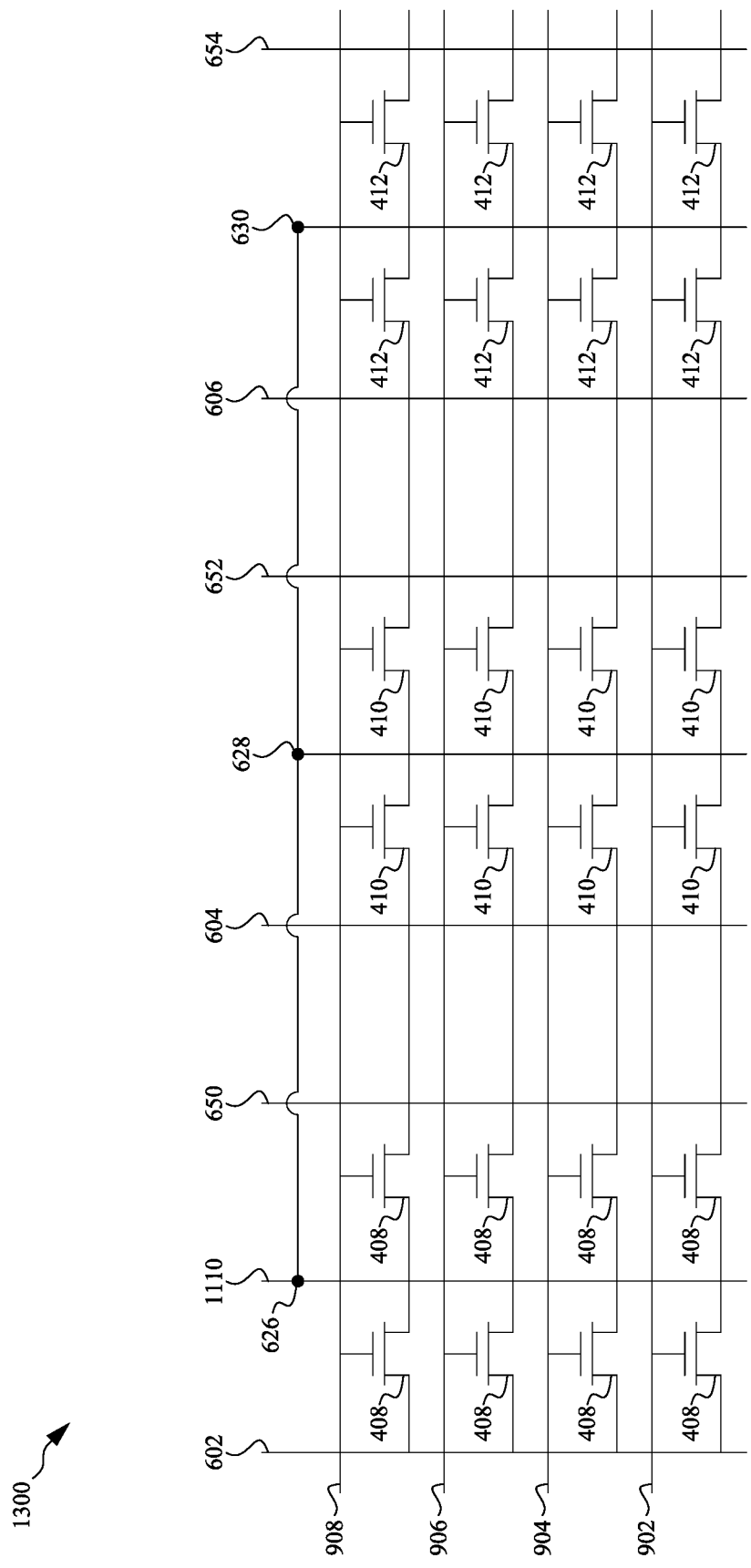
FIG. 13 illustrates a schematic circuit diagram of the example three-dimensional memory device of FIGS. 2 through 12, in accordance with some embodiments.

FIG. 13 illustrates a schematic circuit diagram of a portion of the 3D memory device 200, in accordance with various embodiments. In FIG. 13, the memory strings 408, 410, and 412 are shown. Each of the memory cells may be represented by a transistor, in which each memory cell can be accessed by a respective combination of WL, BL, and SL. For example, in order to access the top one of the memory cells of the memory string 408 (e.g., the memory cell 408A), the WL 908 may be asserted to select that memory cell, with first BL 602 (or the second BL 650) and the SL 626 applied with suitable levels of signals, as described above.

Figure 14:
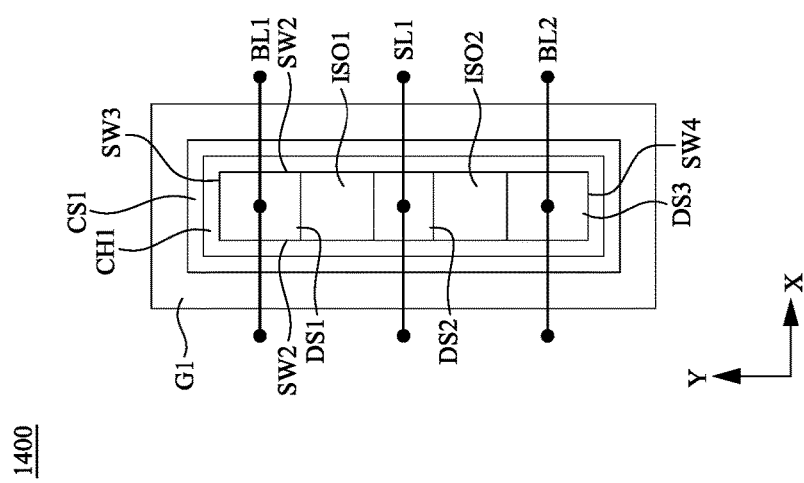
FIG. 14 illustrates a top view of a structure, in accordance with one or more embodiments.

FIG. 14 illustrates a top view of a structure 1400, in accordance with one or more embodiments. In some embodiments, the structure 1400 is one or more of a memory structure, a portion of a 3D memory structure, a semiconductor device, a memory device, a circuit layout of a structure, or the like. In some embodiments, the structure 1400 corresponds to a portion of the 3D memory device 200 (e.g., a portion of the fin-like structure 708 of FIG. 7).

The structure 1400 includes a drain/source structure DS1 (e.g., the first bit line 602 of FIG. 6). The structure 1400 includes a drain/source structure DS2 (e.g., the source line 626 of FIG. 6) spaced from the drain/source structure DS1 in a first direction (e.g., Y direction). The structure 1400 includes a drain/source structure DS3 (e.g., the second bit line 650 of FIG. 6) spaced from the drain/source structure DS2 in the first direction.

The structure 1400 includes an isolation region ISO1 (e.g., dielectric fill material 406 of FIG. 4) that is coupled between the drain/source structure DS1 and the drain/source structure DS2. The structure 400 includes an isolation region ISO2 that is coupled between the drain/source structure DS2 and the drain/source structure DS3.

The structure 1400 includes a channel (e.g., a channel layer) CH1 (e.g., the channel layer 404 of FIG. 4) that wraps around (e.g., surrounds) the drain/source structure DS1, drain/source structure DS2, drain/source structure DS3, the isolation region ISO1, and the isolation region ISO2. The channel CH1 has a first portion extending in the first direction. In some embodiments, the first portion of CH1 is in contact with and/or coupled to a first sidewall of each of the drain/source structures DS1, DS2, and DS3. For example, the first portion of CH1 is in contact with and/or coupled to sidewall SW1 of the drain/source structure DS1. The channel CH1 has a second portion extending in the first direction and spaced from the first portion of CH1 in a second direction (e.g., X direction) perpendicular to the first direction. In some embodiments, the second portion of CH1 is in contact with and/or coupled to sidewall SW2 of the drain/source structure DS1. In some embodiments, the second portion of CH1 is in contact with and/or coupled to a second sidewall of each of the drain/source structures DS1, DS2, and DS3. For example, the second portion of CH1 is in contact with and/or coupled to sidewall SW2 of the drain/source structure DS1. The channel CH1 has a third portion extending in the second direction and coupled between the first portion of CH1 and the second portion of CH1. In some embodiments, the third portion of CH1 is in contact with and/or coupled to a sidewall SW3 of the drain/source structure DS1. The channel CH1 has a fourth portion extending in the second direction, spaced from the third portion of CH1 in the first direction, and coupled between the first portion of CH1 and the second portion of CH1. In some embodiments, the third portion of CH1 is in contact with and/or coupled to a sidewall SW4 of the drain/source structure DS3.

The structure 1400 includes a charge storage layer CS1 (e.g., the ferroelectric layer 402 of FIG. 4) that wraps around the channel CH1, the drain/source structure DS1, drain/source structure DS2, drain/source structure DS3, the isolation region ISO1, and the isolation region ISO2. In some embodiments, the charge storage layer CS1 is in contact with and/or coupled to the channel CH1. The charge storage layer CS1 has a first portion extending in the first direction. In some embodiments, the first portion of CS1 is coupled to a first sidewall of each of the drain/source structures DS1, DS2, and DS3 via the first portion of the channel CH1. The charge storage layer CS1 has second first portion extending in the first direction and spaced from the first portion of CS1 in the second direction. In some embodiments, the second portion of CS1 is coupled to a second sidewall of each of the drain/source structures DS1, DS2, and DS3 via the second portion of the channel CH1. The charge storage layer CS1 has third portion extending in the second direction and coupled between the first portion of CS1 and the second portion of CS2. In some embodiments, the third portion of CS1 is coupled to the sidewall SW3 of the drain/source structure DS1 via the third portion of the channel CH1. The charge storage layer CS1 has fourth portion extending in the second direction, spaced from the third portion of CS1 in the first direction, and coupled between the first portion of CS1 and the second portion of CS2. In some embodiments, the fourth portion of CS1 is coupled to the sidewall SW4 of the drain/source structure DS3 via the fourth portion of the channel CH1.

The structure 1400 includes a gate structure G1 (e.g., the WL 908 of FIG. 9) that wraps around the charge storage layer CS1, the channel CH1, the drain/source structure DS1, drain/source structure DS2, drain/source structure DS3, the isolation region ISO1, and the isolation region ISO2. In some embodiments, the gate structure G1 is in contact with and/or coupled to the charge storage layer CS1.

The structure 1400 includes a bit line BL1 (e.g., the metallization layer 1102 of FIG. 11A). The bit line BL1 extends in the second direction. The bit line BL1 is disposed over (e.g., overlaps, couples to, disposed over in a third direction perpendicular to the first direction and the second direction, in contact with) the drain/source structure DS1.

The structure 1400 includes a select line SL1 (e.g., common select/source line, the metallization layer 1108 of FIG. 11A). The select line SL1 extends in the second direction. The select line SL1 is disposed over the drain/source structure DS2.

The structure 1400 includes a bit line BL2 (e.g., the metallization layer 1110 of FIG. 11A). The bit line BL2 extends in the second direction. The bit line BL2 is disposed over the drain/source structure DS3.

Figure 15:
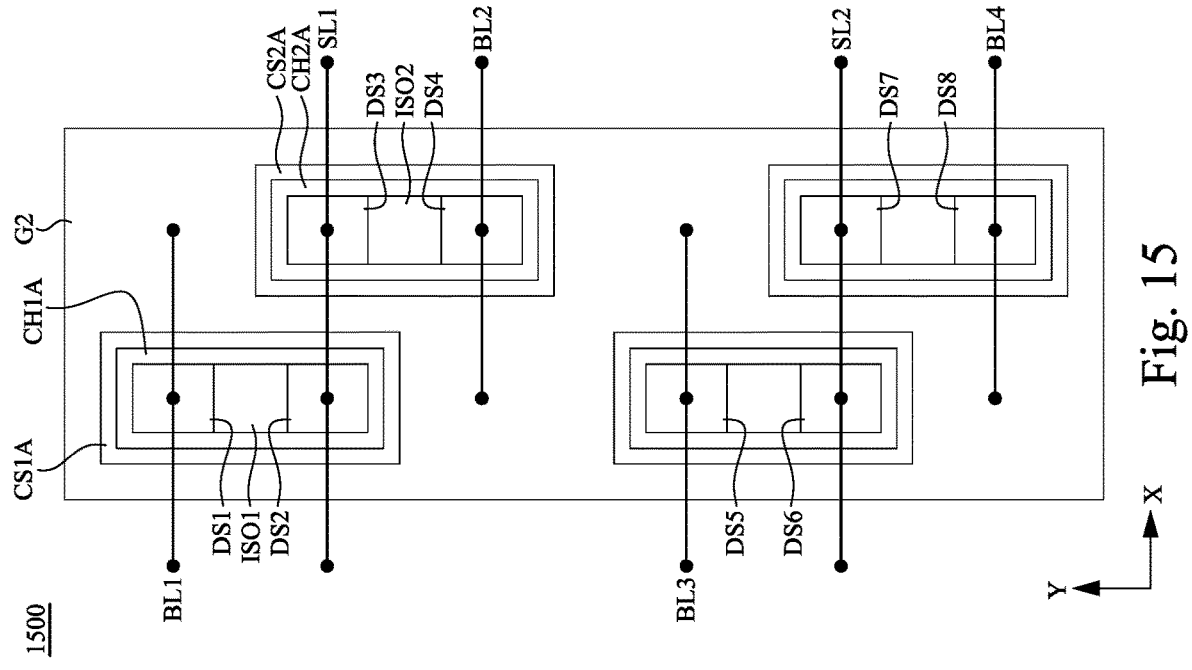
FIG. 15 illustrates a top view of a structure, in accordance with one or more embodiments.

FIG. 15 illustrates a top view of a structure 1500, in accordance with one or more embodiments. In some embodiments, the structure 1500 corresponds to a portion of the 3D memory device 1200. The structure 1500 is similar to the structure 1400 of FIG. 14, except that the structure 1500 includes two structures in which the second structure is staggered with respect to the first structure (e.g., adjacent in the X direction and offset in the Y direction). The structure 1500 includes the drain/source structure DS1 of FIG. 14. The structure 1500 includes the drain/source structure DS2 of FIG. 14 spaced from the drain/source structure DS1 in the first direction. The structure 1500 includes the isolation region ISO1 of FIG. 14 coupled between the drain/source structure DS1 and the drain/source structure DS1. The structure 1500 includes a channel CH1A similar to the channel CH1 of FIG. 14 except that the channel CH1A wraps around the drain/source structure DS1, the drain/source structure DS2, and the isolation region ISO1. The structure 1500 includes a charge storage layer CS1A similar to the charge storage layer CS1 of FIG. 14 except that charge storage layer CS1A wraps around the channel CH1A, the drain/source structure DS1, the drain/source structure DS2, and the isolation region ISO1. The structure 1500 includes a gate structure G2 similar to the gate structure G1 of FIG. 14. A first portion of the gate structure G2 wraps around charge storage layer CS1A, the channel CH1A, the drain/source structure DS1, the drain/source structure DS2, and the isolation region ISO1. Accordingly, in some embodiments, the structure 1500 includes a first structure which includes the first portion of the gate structure G2, the charge storage layer CS1A, the channel CH1A, the drain/source structure DS1, the drain/source structure DS2, and the isolation region ISO1.

The structure 1500 includes the drain/source structure DS3 of FIG. 14 spaced from the drain/source structure DS2 in the second direction. The structure 1500 includes a drain/source structure DS4 spaced from the drain/source structure DS3 in the first direction. The structure 1500 includes the isolation region ISO2 of FIG. 14 coupled between the drain/source structure DS3 and the drain/source structure DS4. The structure 1500 includes a channel CH2A similar to the channel CH1 of FIG. 14 except that the channel CH2A wraps around the drain/source structure DS3, the drain/source structure DS4, and the isolation region ISO2. The structure 1500 includes a charge storage layer CS2A similar to the charge storage layer CS1 of FIG. 14 except that charge storage layer CS2A wraps around the channel CH2A, the drain/source structure DS3, the drain/source structure DS4, and the isolation region ISO2. A second portion of the gate structure G2 wraps around charge storage layer CS2A, the channel CH2A, the drain/source structure DS3, the drain/source structure DS4, and the isolation region ISO2. Accordingly, in some embodiments, the structure 1500 includes a second structure which includes the second portion of the gate structure G2, the charge storage layer CS2A, the channel CH2A, the drain/source structure DS3, the drain/source structure DS4, and the isolation region ISO2. A third portion (e.g., some of the first portion and some of the second portion) of the gate structure G2 is coupled between the charge storage layer CS1A and the charge storage layer CS2A.

The structure 1500 includes the bit line BL1 of FIG. 14. The bit line BL1 is disposed over the drain/source structure DS1. The structure 1500 includes a select line SL1 of FIG. 14. The select line SL1 is disposed over the drain/source structure DS2 and the drain/source structure DS3. The structure 1400 includes the bit line BL2 of FIG. 14. The bit line BL2 is disposed over the drain/source structure DS4.

In some embodiments, the structure 1500 includes multiple instances of the first structure and the second structure. For example, the structure 1500 includes a third structure spaced from the first structure in the first direction and the structure 1500 includes a fourth structure spaced from the second structure in the first direction. The third structure includes a drain/source structure DS5 and a drain/source structure DS6 spaced from the drain/source structure DS5 in the first direction. The fourth structure includes a drain/source structure DS7 spaced from the drain/source structure DS6 in the second direction and a drain/source structure DS8 spaced from the drain/source structure DS7 in the first direction. The structure 1500 includes a bit line BL3 disposed over the drain/source structure DS5. The structure 1500 includes a select line SL2 disposed over the drain/source structure DS6 and the drain/source structure DS7. The structure 1500 includes a bit line BL4 disposed over the drain/source structure DS8.

Figure 16:
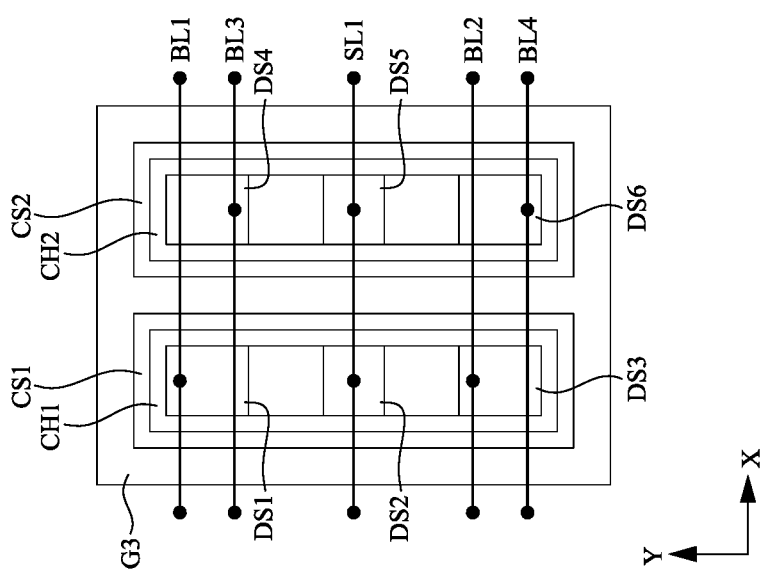
FIG. 16 illustrates a top view of a structure, in accordance with one or more embodiments.

FIG. 16 illustrates a top view of a structure 1600, in accordance with one or more embodiments. In some embodiments, the structure 1600 corresponds to a portion of a first 3D memory. The first 3D memory device can be formed using same process steps as process steps to form the 3D memory device 200. The structure 1600 is similar to the structure 1400 of FIG. 14, except that the structure 1600 includes two structures in which each of the two structures are similar to the structure 1400 of FIG. 14 except for how the bit lines and the select line are arranged. The first structure of the structure 1600 includes a first portion of the gate structure G3 similar to the gate structure G1 of FIG. 14, the charge storage layer CS1 of FIG. 14, the channel CH1 of FIG. 14, the drain/source structure DS1 of FIG. 14, the drain/source structure DS2 of FIG. 14, and the drain/source structure DS3 of FIG. 14. In some embodiments, the second structure of the structure 1600 is similar to the first structure of the structure 1600 except that the second structure is aligned with the first structure and spaced from the first structure in the second direction.

The second structure of the structure 1600 includes the drain/source structure DS4 of FIG. 15, the drain/source structure DS5 of FIG. 15, and the drain/source structure DS6 of FIG. 15. The second structure of the structure 1600 includes a channel CH2 which wraps around the drain/source structure DS4, the drain/source structure DS5, and the drain/source structure DS6. The second structure of the structure 1600 includes a charge storage layer CS2 which wraps around the channel CH2, the drain/source structure DS4, the drain/source structure DS5, and the drain/source structure DS6. The second structure of the structure 1600 includes a second portion of the gate structure G3 which wraps around the charge storage layer CS2, the channel CH2, the drain/source structure DS4, the drain/source structure DS5, and the drain/source structure DS6. A third portion of the gate structure G3 is coupled between the charge storage layer CS1 and the charge storage layer CS2.

The structure 1600 includes the bit line BL1 of FIG. 14. The bit line BL1 is disposed over the drain/source structure DS1 and the drain/source structure DS4. In some embodiments, the bit line BL1 is in contact with the drain/source structure DS1 but not the drain/source structure DS4. The structure 1600 includes a select line SL1 of FIG. 14. The select line SL1 is disposed over the drain/source structure DS2 and the drain/source structure DS5. The structure 1600 includes the bit line BL2 of FIG. 14. The bit line BL2 is disposed over the drain/source structure DS3 and the drain/source structure DS6. In some embodiments, the bit line BL2 is in contact with the drain/source structure DS3 but not the drain/source structure DS6.

In some embodiments, the structure 1600 includes the bit line BL3 of FIG. 15. In some embodiments, the bit line BL3 is disposed over the drain/source structure DS1 and the drain/source structure DS4. In some embodiments, the bit line BL3 is in contact with the drain/source structure DS4 but not the drain/source structure DS1. In some embodiments, the structure 1600 includes the bit line BL4 of FIG. 15. In some embodiments, the bit line BL4 is disposed over the drain/source structure DS3 and the drain/source structure DS6. In some embodiments, the bit line BL4 is in contact with the drain/source structure DS6 but not the drain/source structure DS3.

Figure 17:
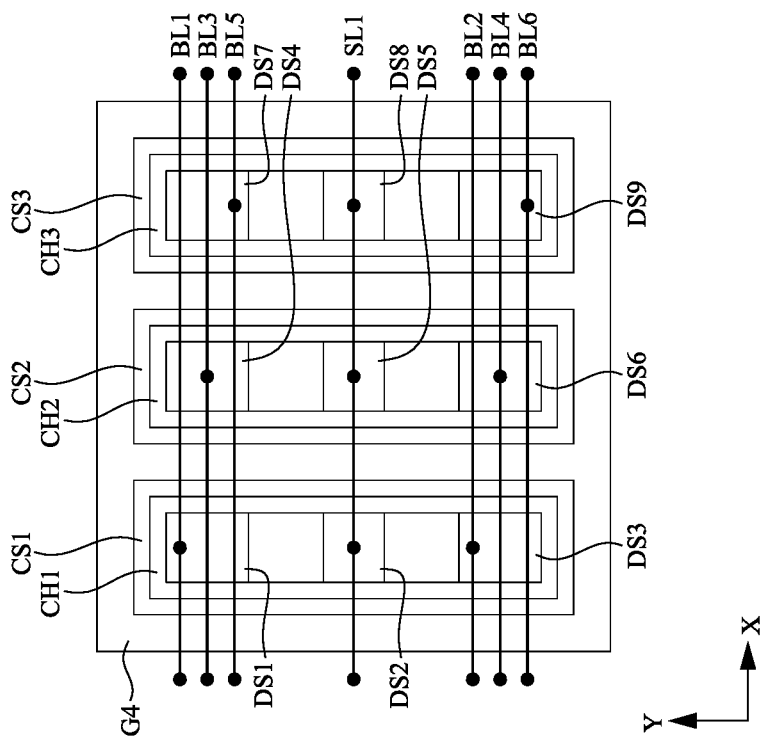
FIG. 17 illustrates a top view of a structure, in accordance with one or more embodiments.

FIG. 17 illustrates a top view of a structure 1700, in accordance with one or more embodiments. In some embodiments, the structure 1700 corresponds to a portion of a second 3D memory. The second 3D memory device can be formed using same process steps as process steps to form the 3D memory device 200. The structure 1700 is similar to the structure 1600 of FIG. 16, except that the structure 1600 includes three structures. The first structure of the structure 1700 is similar to the first structure of the structure 1600 and the second structure of the structure 1700 is similar to the second structure of the structure 1600. The third structure of the structure 1700 is aligned with the second structure and spaced from the second structure in the second direction The third structure of the structure 1700 includes the drain/source structure DS7, the drain/source structure DS8, and the drain/source structure DS9. The third structure of the structure 1700 includes the channel CH3 which wraps around the drain/source structure DS7, the drain/source structure DS8, and the drain/source structure DS9. The third structure of the structure 1700 includes the charge storage layer CS3 which wraps around the channel CH3, the drain/source structure DS7, the drain/source structure DS8, and the drain/source structure DS9. The third structure of the structure 1700 includes a gate structure G4. A first portion of the gate structure G4 wraps around the first structure of the structure 1700. A second portion of the gate structure G4 wraps around the second structure of the structure 1700. A third portion of the gate structure G4 wraps around the charge storage layer CS3, the channel CH3, the drain/source structure DS7, the drain/source structure DS8, and the drain/source structure DS9. A fourth portion of the gate structure G4 is coupled between the charge storage layer CS2 and the charge storage layer CS3.

The structure 1700 includes the bit line BL1 of FIG. 14. The bit line BL1 is disposed over the drain/source structure DS1, the drain/source structure DS4, and the drain/source structure DS7. In some embodiments, the bit line BL1 is in contact with the drain/source structure DS1 but not the drain/source structure DS4 or the drain/source structure DS7. The structure 1700 includes a select line SL1 of FIG. 14. The select line SL1 is disposed over the drain/source structure DS2, the drain/source structure DS5, and the drain/source structure DS8. The structure 1700 includes the bit line BL2 of FIG. 14. The bit line BL2 is disposed over the drain/source structure DS3, the drain/source structure DS6, and the drain/source structure DS9. In some embodiments, the bit line BL2 is in contact with the drain/source structure DS3 but not the drain/source structure DS6 or the drain/source structure DS9.

In some embodiments, the structure 1700 includes the bit line BL3 of FIG. 15. In some embodiments, the bit line BL3 is disposed over the drain/source structure DS1, the drain/source structure DS4, and the drain/source structure DS7. In some embodiments, the bit line BL3 is in contact with the drain/source structure DS4 but not the drain/source structure DS1 or the drain/source structure DS7. In some embodiments, the structure 1700 includes the bit line BL4 of FIG. 15. In some embodiments, the bit line BL4 is disposed over the drain/source structure DS3, the drain/source structure DS6, and the drain/source structure DS9. In some embodiments, the bit line BL4 is in contact with the drain/source structure DS6 but not the drain/source structure DS3 or the drain/source structure DS9.

In some embodiments, the structure 1700 includes a bit line BL5. In some embodiments, the bit line BL5 is disposed over the drain/source structure DS1, the drain/source structure DS4, and the drain/source structure DS7. In some embodiments, the bit line BL5 is in contact with the drain/source structure DS7 but not the drain/source structure DS1 or the drain/source structure DS4. In some embodiments, the structure 1700 includes a bit line BL6. In some embodiments, the bit line BL6 is disposed over the drain/source structure DS3, the drain/source structure DS6, and the drain/source structure DS9. In some embodiments, the bit line BL6 is in contact with the drain/source structure DS9 but not the drain/source structure DS3 or the drain/source structure DS6.

Figure 18:
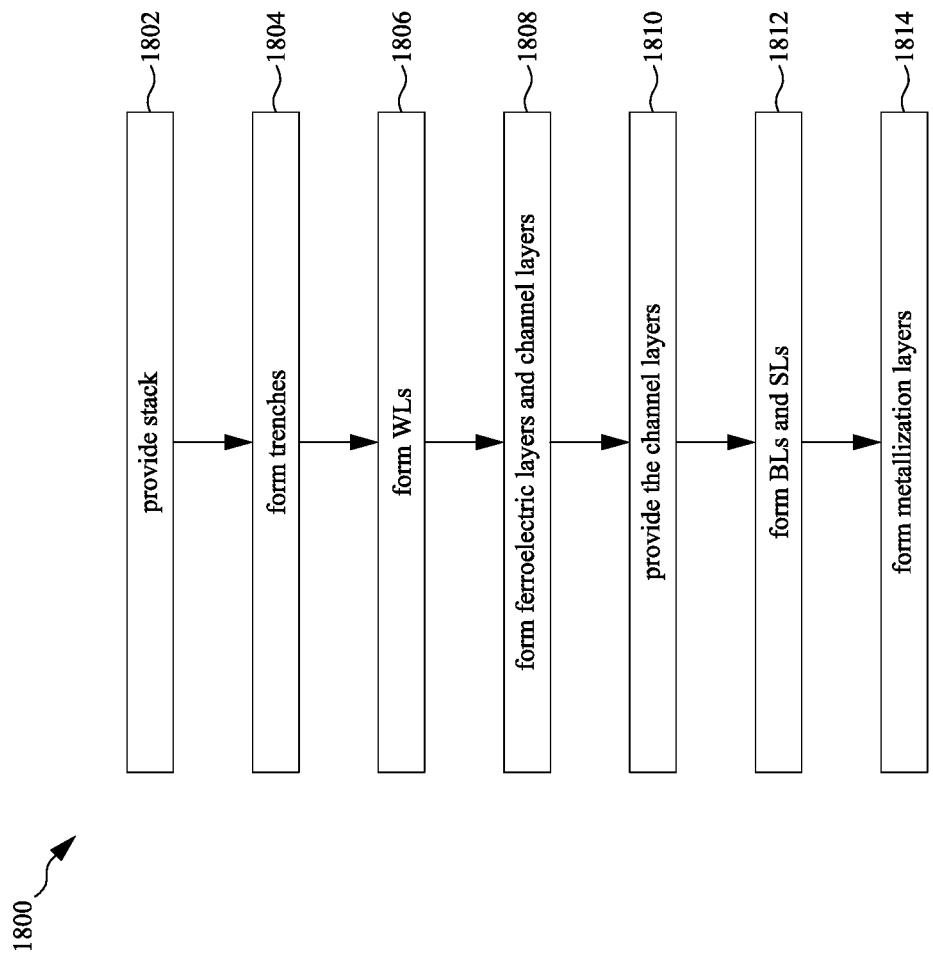
FIG. 18 illustrates a flow chart of an example method for making a three-dimensional memory device, in accordance with some embodiments.

FIG. 18 illustrates a flowchart of a method 1800 to form a 3D memory device, according to one or more embodiments of the present disclosure. For example, at least some of the operations (or steps) of the method 1800 can be used to form a 3D ferroelectric memory device. It is noted that the method 1800 is merely an example, and is not intended to limit the present disclosure. Accordingly, it is understood that additional operations may be provided before, during, and after the method 1800 of FIG. 18, and that some other operations may only be briefly described herein. In some embodiments, operations of the method 1800 may be associated with perspective and/or top views of an example 3D memory device at various fabrication stages as shown in FIGS. 19, 20, 21, 22, 23, 24A, and 24B, respectively, which will be discussed in further detail below.

In brief overview, the method 1800 starts with operation 1802 of providing a stack of insulating layers and sacrificial layers over a substrate. The method 1800 continues to operation 1804 of forming a number of trenches. The method 1800 continues to operation 1806 of forming a number of WLs. The method 1800 continues to operation 1808 of forming a number of ferroelectric layers and a number of channel layers. The method 1800 continues to operation 1810 of patterning the channel layers. The method 1800 continues to operation 1812 of forming a number of bit lines and a number of source/select lines. The method 1800 continues to operation 1814 of forming metallization layers.

Figure 19:
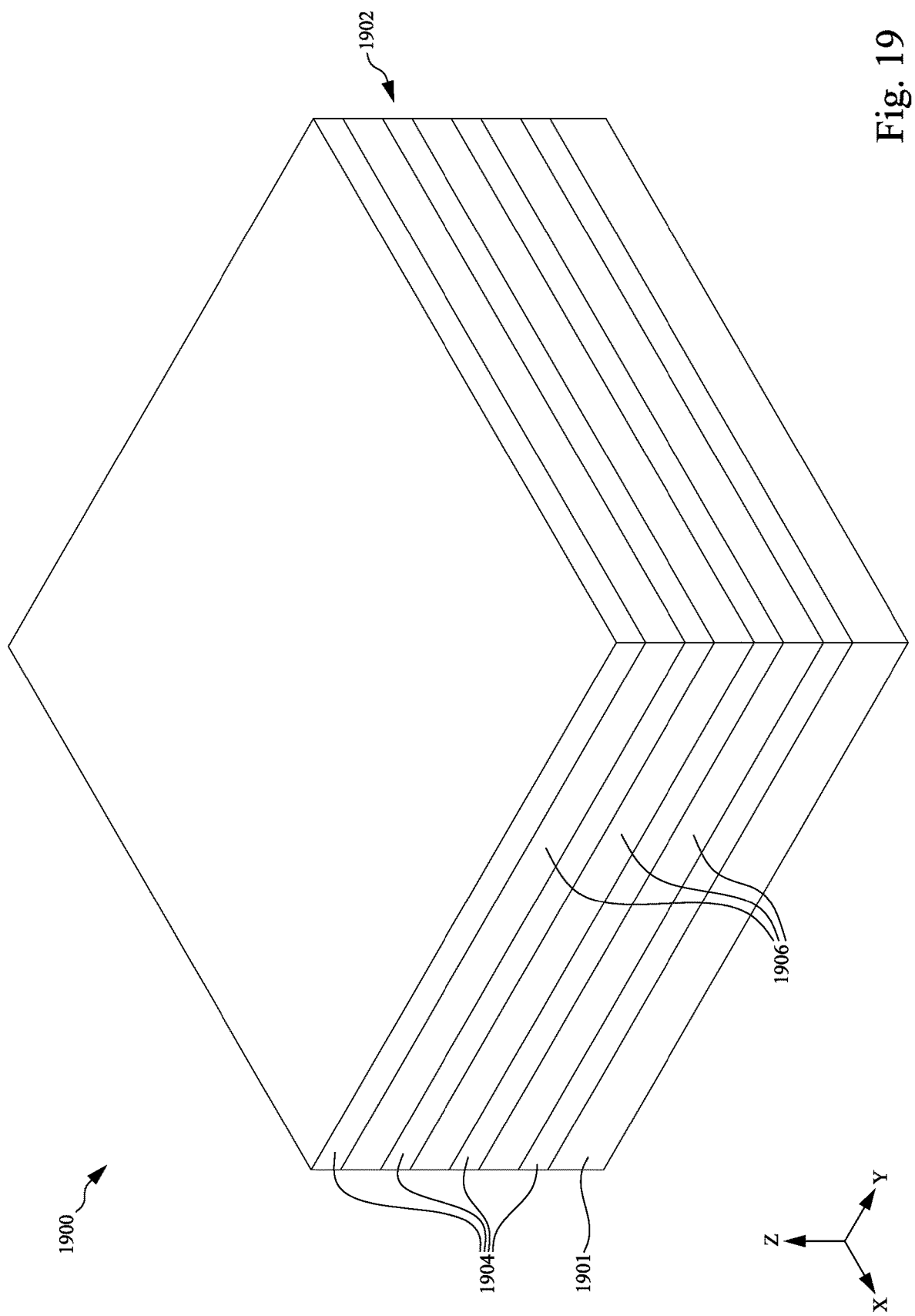
FIGS. 19, 20, 21, 22, 23, 24A, and 24B each illustrate a perspective or top view of an example three-dimensional memory device during various fabrication stages, made by the method of FIG. 18, in accordance with some embodiments.

Corresponding to operation 1802 of FIG. 18, FIG. 19 is a perspective view of the 3D memory device 1900 including a stack 1902 formed over a semiconductor substrate 1901 at one of the various stages of fabrication, in accordance with various embodiments. The substrate 1901 may be similar to the substrate 201 of FIG. 19.

The stack 1902 includes a number of insulating layers 1904 and a number of sacrificial layers 1906 alternately stacked on top of one another over the substrate 1901 along a vertical direction (e.g., the Z direction). Although four insulating layers 1904 and three sacrificial layers 1906 are shown in the illustrated embodiment of FIG. 19, it should be understood that the stack 1902 can include any number of insulating layers and any number of sacrificial layers alternately disposed on top of one another, while remaining within the scope of the present disclosure. Further, although the stack 1902 directly contacts the substrate 1901 in the illustrated embodiment of FIG. 19, it should be understood that the stack 1902 is separated from the substrate 1901 (as mentioned above).

The insulating layers 1904 are similar to the insulating layers 204 of FIG. 2. The sacrificial layers 1906 are similar to the sacrificial layers 206 of FIG. 2. The stack 1902 can be formed similarly to how the stack 202 of FIG. 2 is formed.

Figure 20:
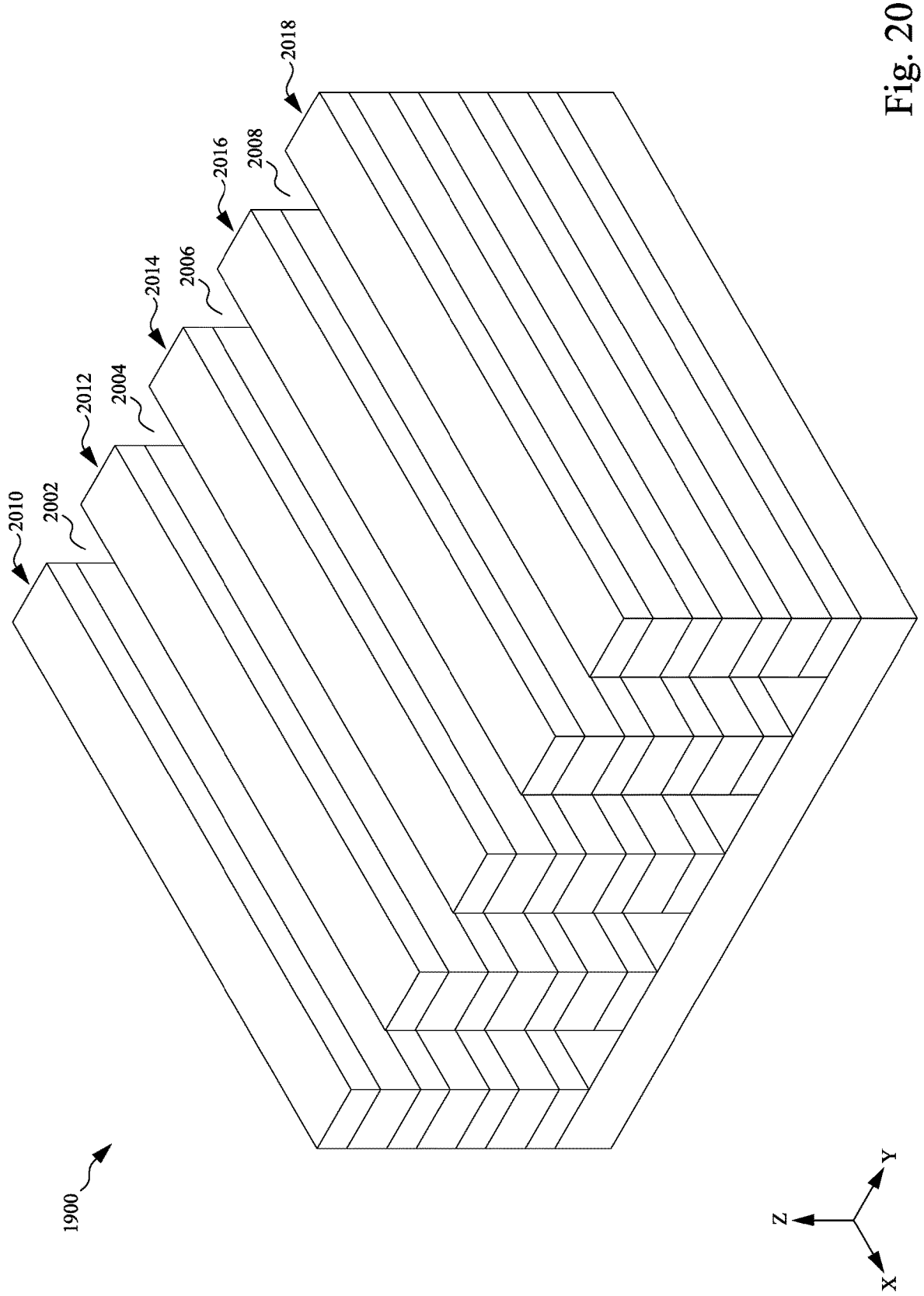

Corresponding to operation 1804 of FIG. 18, FIG. 20 is a perspective view of the 3D memory device 1900 in which the stack 1902 is patterned to form trenches 2002, 2004, 2006, and 2008 at one of the various stages of fabrication, in accordance with various embodiments. Although four trenches 2002-2008 are shown in the illustrated embodiment of FIG. 20, it should be understood that the 3D memory device 1900 can include any number of trenches, while remaining within the scope of the present disclosure. The trenches 2002-2008 all extend along a lateral direction (e.g., the X direction). The trenches 2002-2008 can be formed similarly to how the first trenches 302 of FIG. 3 are formed.

As a result of forming the trenches 2002-2008, fin-like structures 2010, 2012, 2014, 2016, and 2018 are formed at one of the various stages of fabrication, in accordance with various embodiments. As shown, the fin-like structures 2010 to 2018 (sometimes referred to as stripe structures) all extend along a lateral direction (e.g., the X direction), and are in parallel with one another. Each of the fin-like structures 2010 to 2018 includes a number of layers (or tiers) alternately stacked on top of one another. In particular, each fin-like structure includes an alternate stack of a number of (remaining portions of) the insulating layers 1904 and a number of (remaining portions of) the sacrificial layers 1906.

Figure 21:
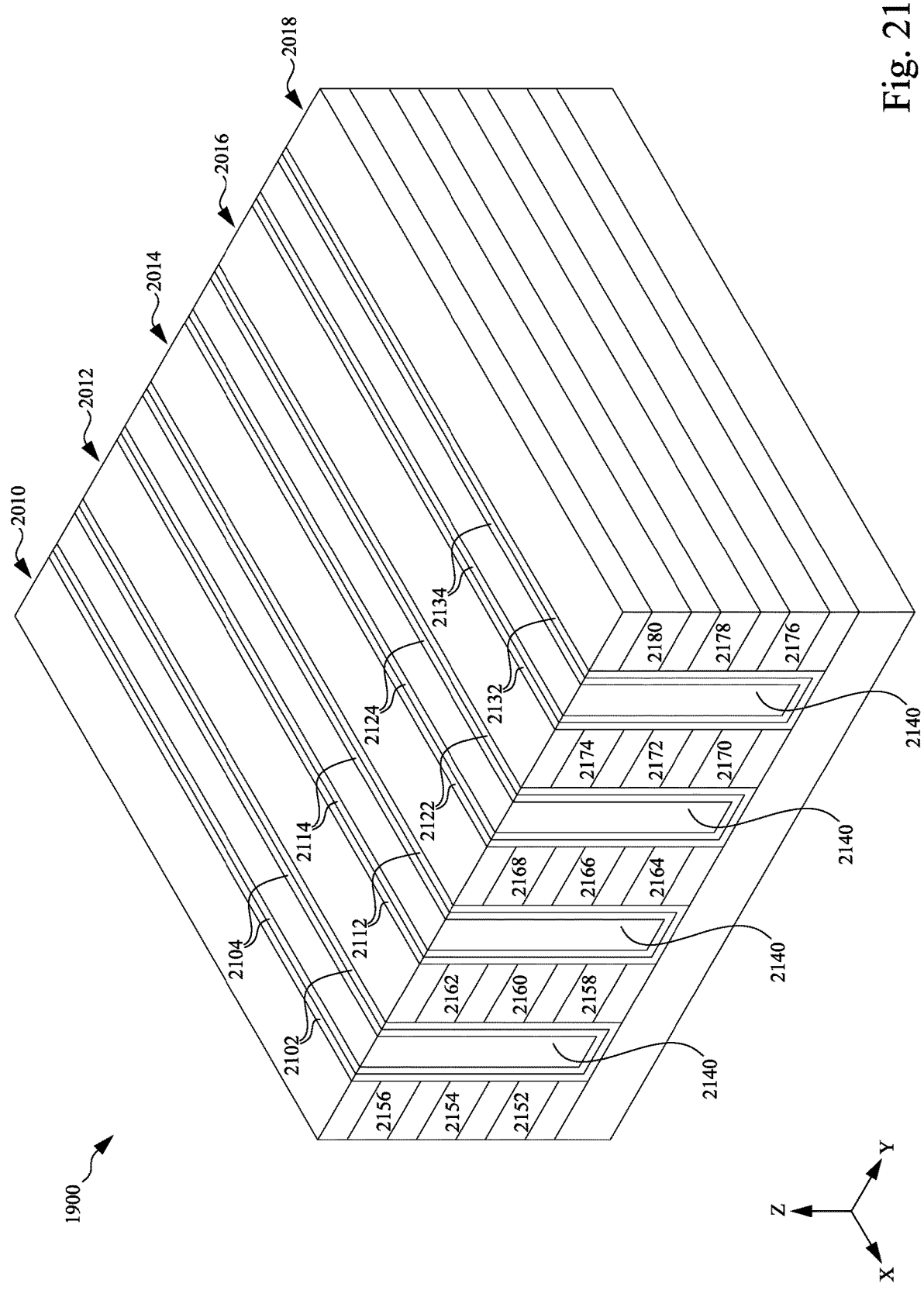

Corresponding to operations 1806 to 1808 of FIG. 18, FIG. 21 is a perspective view of the 3D memory device 1900 including a number of WLs in each of the fin-like structures 2010 to 2018 and a ferroelectric layer and a channel layer in each of the trenches 2002 to 2008 at one of the various stages of fabrication, in accordance with various embodiments.

Each of the sacrificial layers 1906 may be recessed (e.g., along the Y direction) to laterally extend the trenches 2002-2008 by generating recesses in the fin-like structures 2010 to 2018. The sacrificial layers 1906 can be recessed by performing the same second etching process performed to recess the sacrificial layers 206 in FIG. 2.

The WLs 2152-2180 can be formed by filling the recesses in the fin-like structures 2010 to 2018 with a metallic fill layer. The metallic fill layer is similar to the metallic fill layer used to form the WLs 902-910 in FIG. 9. The WLs 2152-2180 can be formed by similar processes as those used to form the WLs 902-910 in FIG. 9.

In various embodiments, each of the ferroelectric layers includes two portions, each of which is formed to extend along one of the sidewalls of a corresponding trench. As such, each portion of the ferroelectric layer is in contact with a corresponding number of WLs (through their respective exposed sidewalls). Over each ferroelectric layer, a channel layer also includes two portions that are in contact with the two portions of that ferroelectric layer, respectively. As shown in the illustrated example of FIG. 21, a ferroelectric layer 2102 and a channel layer 2104 are formed in the trench 2002; a ferroelectric layer 2112 and a channel layer 2114 are formed in the trench 2004; a ferroelectric layer 2132 and a channel layer 2124 are formed in the trench 2006; and a ferroelectric layer 2142 and a channel layer 2144 are formed in the trench 2008. Taking the ferroelectric layer 2102 and the channel layer 2104 in the trench 2002 as a representative example, the ferroelectric layer 2102 that extends along the X direction has two portions, one of which is in contact with the WLs 2152-2156, and the other of which is in contact with the WLs 2158-2162.

Further, as each of the ferroelectric layers, channel layers, and gate dielectric layers may be conformally formed over the trench as a liner layer (which will be discussed below), at least the ferroelectric layers and channel layers may each present an L-shaped profile, as shown in FIG. 21. Alternatively stated, in addition to the (vertical) portions that contact the respective WLs, each ferroelectric layer can have (lateral) leg portions. In particular, each ferroelectric layer has two leg portions (extending along the Y direction) pointing to each other. Similarly, in addition to the (vertical) portions that contact the respective ferroelectric layer, each channel layer can have (lateral) leg portions. Each channel layer has two leg portions (extending along the Y direction) pointing to each other. Other profiles of the ferroelectric layers and channel layers are within the scope of the present disclosure.

The ferroelectric layers 2102, 2112, 2122, and 2132 each include a ferroelectric material similar to the ferroelectric material used in the ferroelectric layers 402 of FIG. 4. The ferroelectric material (of the ferroelectric layers 2102, 2112, 2122, and 2132) can be deposited similarly to how the ferroelectric material of the ferroelectric layers 402 of FIG. 4 is deposited. The thickness of the ferroelectric material (of the ferroelectric layers 2102, 2112, 2122, and 2132) can be similar to the thickness of the ferroelectric material of the ferroelectric layers 402 of FIG. 4

The semiconductor material (of the channel layers 2104, 2114, 2124, and 2134) can be formed similarly to how the channel layers 404 of FIG. 4 are formed. The thickness of the semiconductor material (of the channel layers 2104, 2114, 2124, and 2134) can be similar to the thickness of the semiconductor material of the channel layers 404 of FIG. 4.

The above-mentioned ferroelectric material and semiconductor material may be sequentially formed similarly to how the ferroelectric material and semiconductor material of FIG. 4 are sequentially formed. Further, a dielectric fill material 2140 can be deposited over the workpiece to fill any unfilled volume within the trenches 2002 to 2008. The dielectric fill material 2140 can be similar to the dielectric fill material 406 of FIG. 4.

Figure 22:
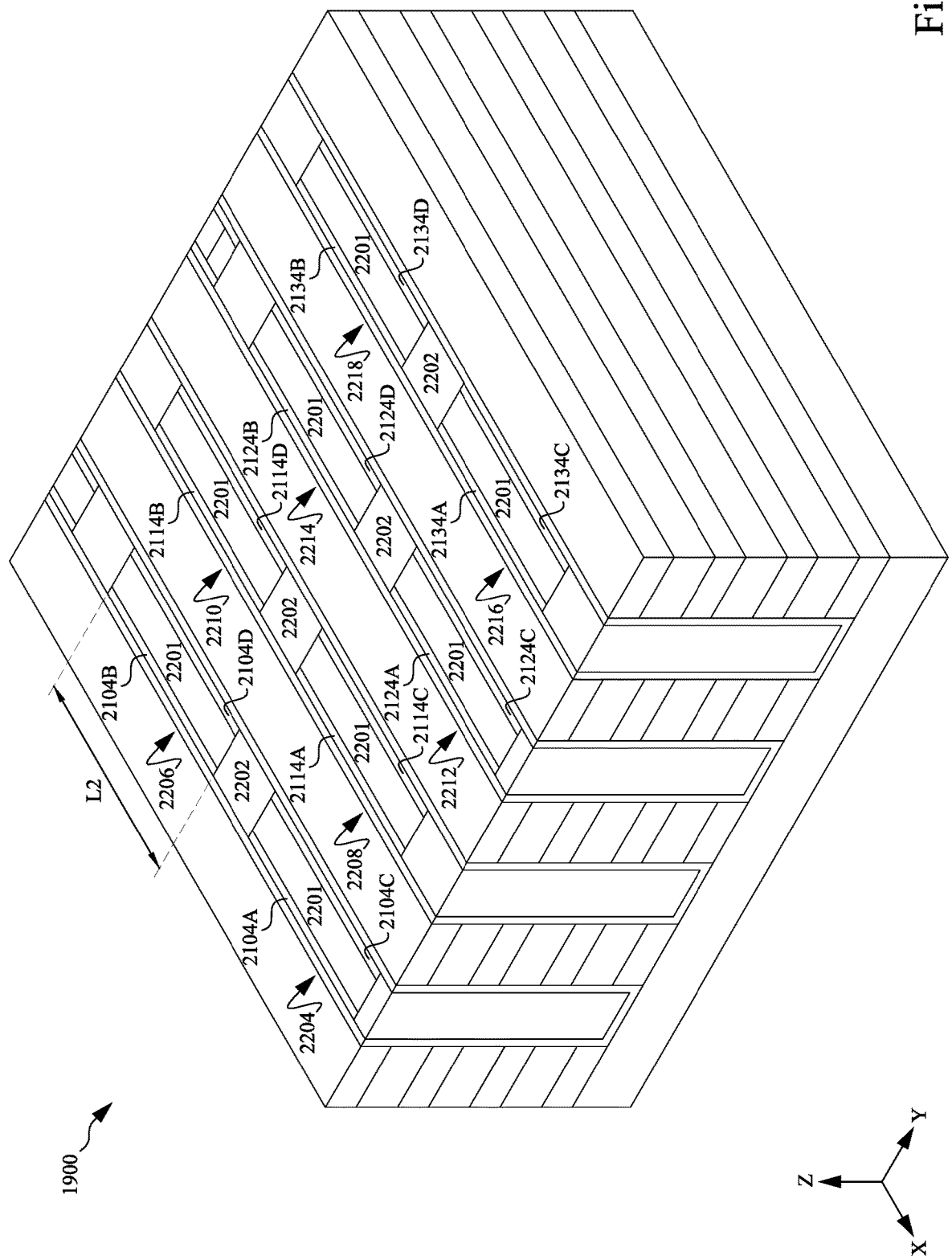

Corresponding to operation 1810 of FIG. 18, FIG. 22 is a perspective view of the 3D memory device 1900 in which the channel layers 2104, 2114, 2124, and 2134 are patterned at one of the various stages of fabrication, in accordance with various embodiments.

The dielectric fill material 2140 may be patterned to define initial footprints of memory strings 2204 to 2218, which will be discussed in further detail below. The remaining portions of the dielectric fill material 2140 are referred to as dielectric fill material 2201. As shown in FIG. 18, the dielectric fill material 2140 is etched to form trench portions in between the footprints for the memory strings 2204 to 2218. For example, a first trench portion can be formed between the memory strings 2204 and 2206. The etching can be performed by a similar process as done in FIG. 5 to etch the dielectric fill material 406 of FIG. 4.

Next, a dummy dielectric material may be deposited in the trench portions, followed by a CMP process. The dummy dielectric material can be formed by chemical vapor deposition (CVD), plasma enhanced CVD (PECVD), low pressure CVD (LPCVD), or other deposition techniques, which are within the scope of the present disclosure. In various embodiments, the dummy dielectric material includes an insulating material which is a sacrificial material that can be subsequently removed. Non-limiting examples of the dummy dielectric material include silicon nitride, an amorphous semiconductor material (such as amorphous silicon), and a polycrystalline semiconductor material (such as poly-silicon). Other materials are within the scope of the present disclosure. In one embodiment, the dummy dielectric material can be spacer material layers that include silicon nitride or a semiconductor material including at least one of silicon or germanium. Other materials are within the scope of the present disclosure.

Next, the channel layers 2114, 2124, and 2134 are each patterned by, for example, an anisotropic etching process to form a number of portions. Other methods of patterning the channel layers 2114, 2124, and 2134 are within the scope of the present disclosure. In various embodiments, each of such channel segments may extend along a lateral direction (e.g., the X direction) with a length ($L_2$), which may be configured to define the physical channel length of a memory cell. Other methods of forming the channel segments 2134A-2134D are within the scope of the present disclosure. In the trench 2002, the channel layer 2104 is patterned to form a number of channel segments 2104A, 2104B, 2104C, and 2104D; in the trench 2004, the channel layer 2114 is patterned to form a number of channel segments 2114A, 2114B, 2114C, and 2114D; in the trench 2006, the channel layer 2124 is patterned to form a number of channel segments 2124A, 2124B, 2124C, and 2124D; and in the trench 2008, the channel layer 2134 is patterned to form a number of channel segments 2134A, 2134B, 2134C, and 2134D. Other methods of forming the channel segments 2134A-2134D are within the scope of the present disclosure.

Next, the trenches 2002 through 2008 are again filled out by the dielectric fill material 2202. The dielectric fill material 2202 may be deposited similarly to how the dielectric fill material 406 of FIG. 4 is deposited. Any excess dielectric fill material may be deposited similarly to how the excess dielectric fill material described in view of FIG. 4 is removed.

Figure 23:
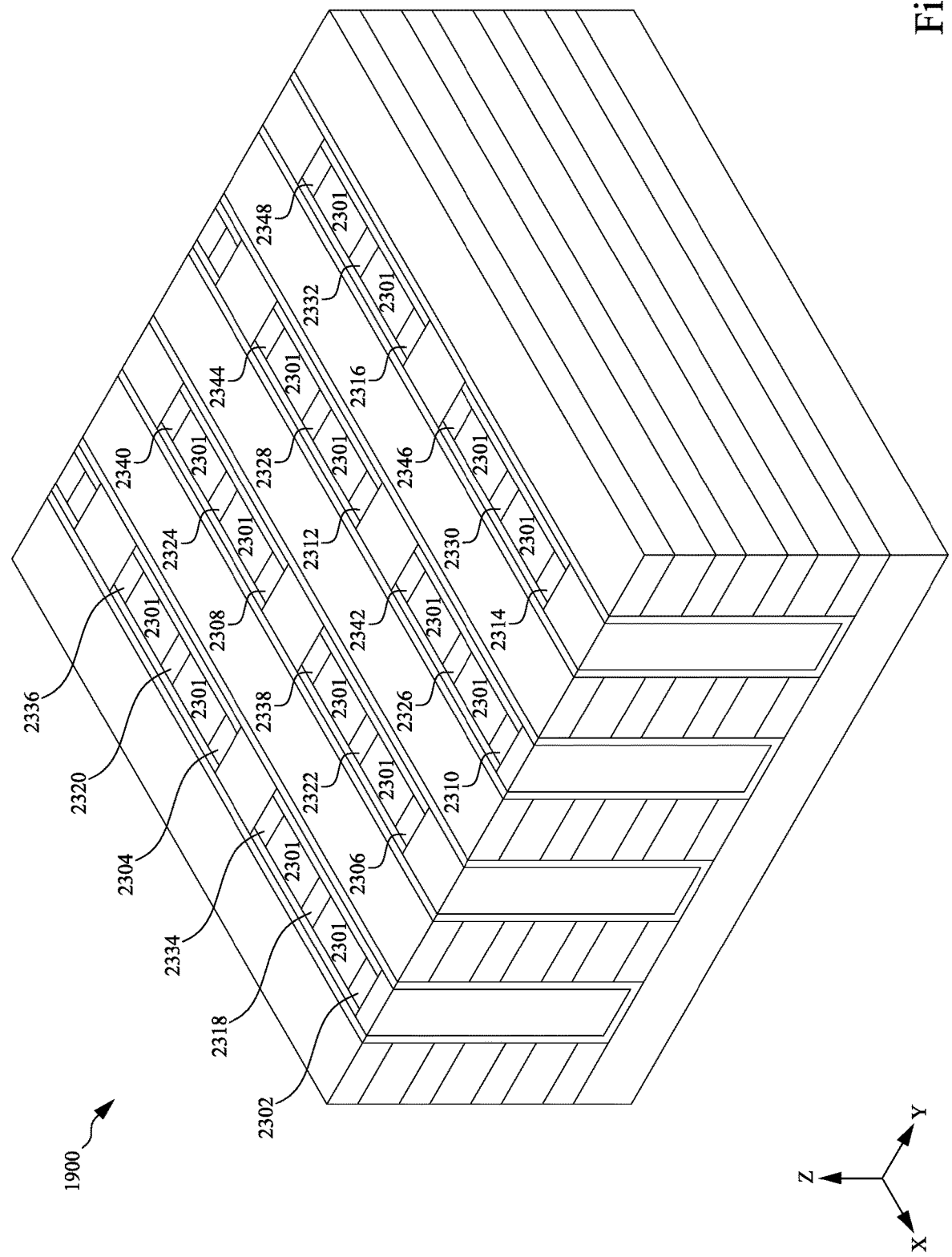

Corresponding to operation 1812 of FIG. 18, FIG. 23 is a perspective view of the 3D memory device 1900 including a number of first BLs, 2302, 2304, 2306, 2308, 2310, 2312, 2314, and 2316, a number of SLs, 2318, 2320, 2322, 2324, 2326, 2328, 2330, and 2332, and a number of second BLs, 2334, 2336, 2338, 2340, 2342, 2344, 2346, and 2348, at one of the various stages of fabrication, in accordance with various embodiments.

The dielectric fill material 2201 may be patterned to define initial footprints of a number of bit lines (BLs) and source lines (SLs), which will be discussed in further detail below. The patterning generates trench portions in each of the memory strings 2204 to 2218. The dielectric fill material 2201 is patterned (or otherwise separated) by a similar etching process as the etching process to pattern the dielectric fill material 406 of FIG. 4. The remaining portion of the dielectric fill material 2201 (e.g., the dielectric fill material 2301) can be configured to electrically isolate a first bit line (BL), a second BL, and source line (SL) of each memory cell of a certain string of the memory device 1900 from each other, which will be discussed in further detail below.

The first BLs 2302 through 2316, the SLs 2318 through 2332, and the second BLs 2334 through 2348 can be formed by filling the trench portions with a metal material. The metal material may be the same as the metal material used to fill the trench portions of the first trenches 302 of FIG. 3.

Upon forming the first BLs 2302-2316, the SLs 2318-2332, and the second BLs 2334-2348, each memory cell of the memory strings 2204 to 2218 can be accessed through its respective WL, BL, and SL and can be programmed, erased and read in a similar way to how the memory cell of the memory strings 408 through 430 of FIG. 4 can be programmed, erased, and read.

Figure 24A:
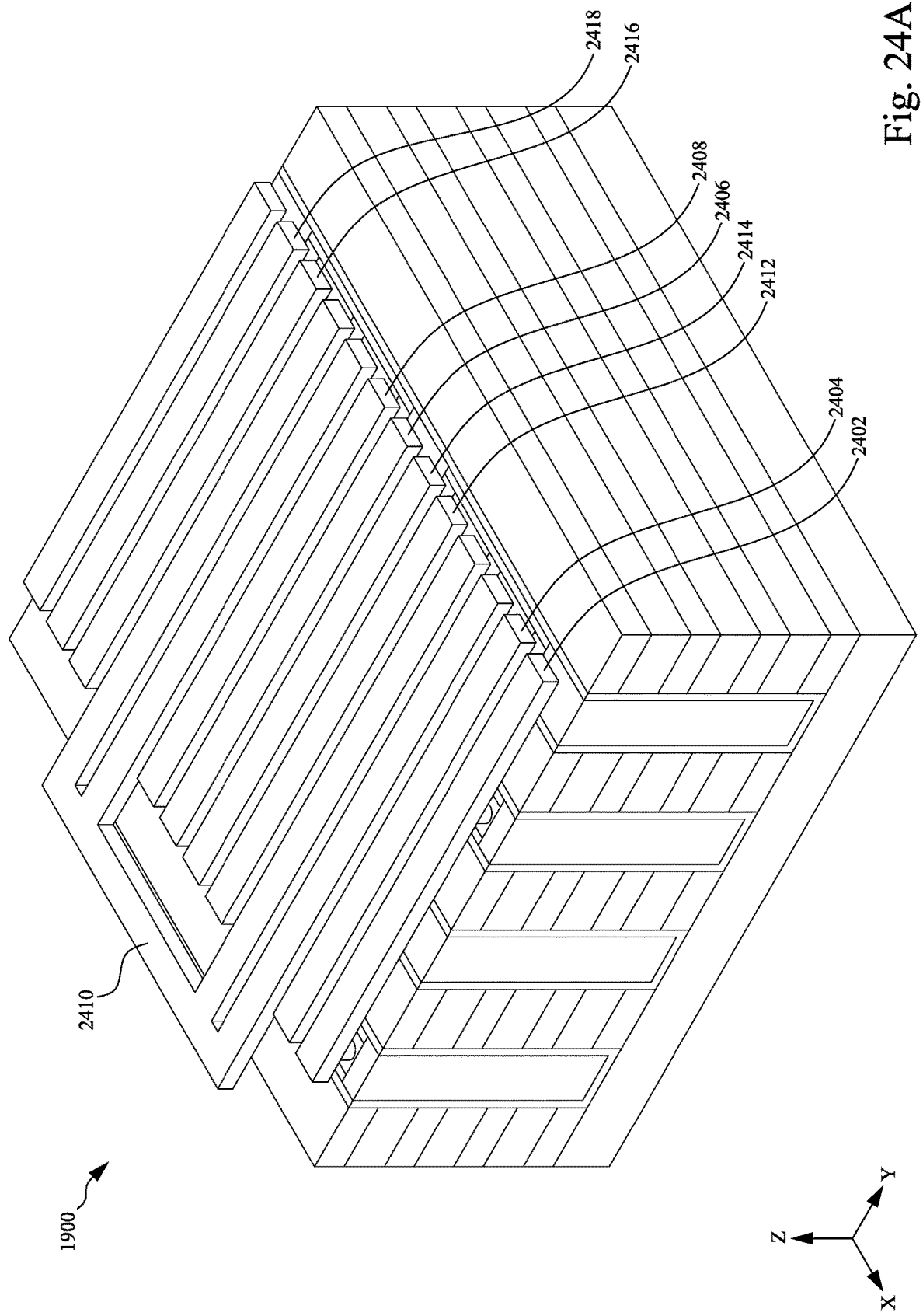
Figure 24B:
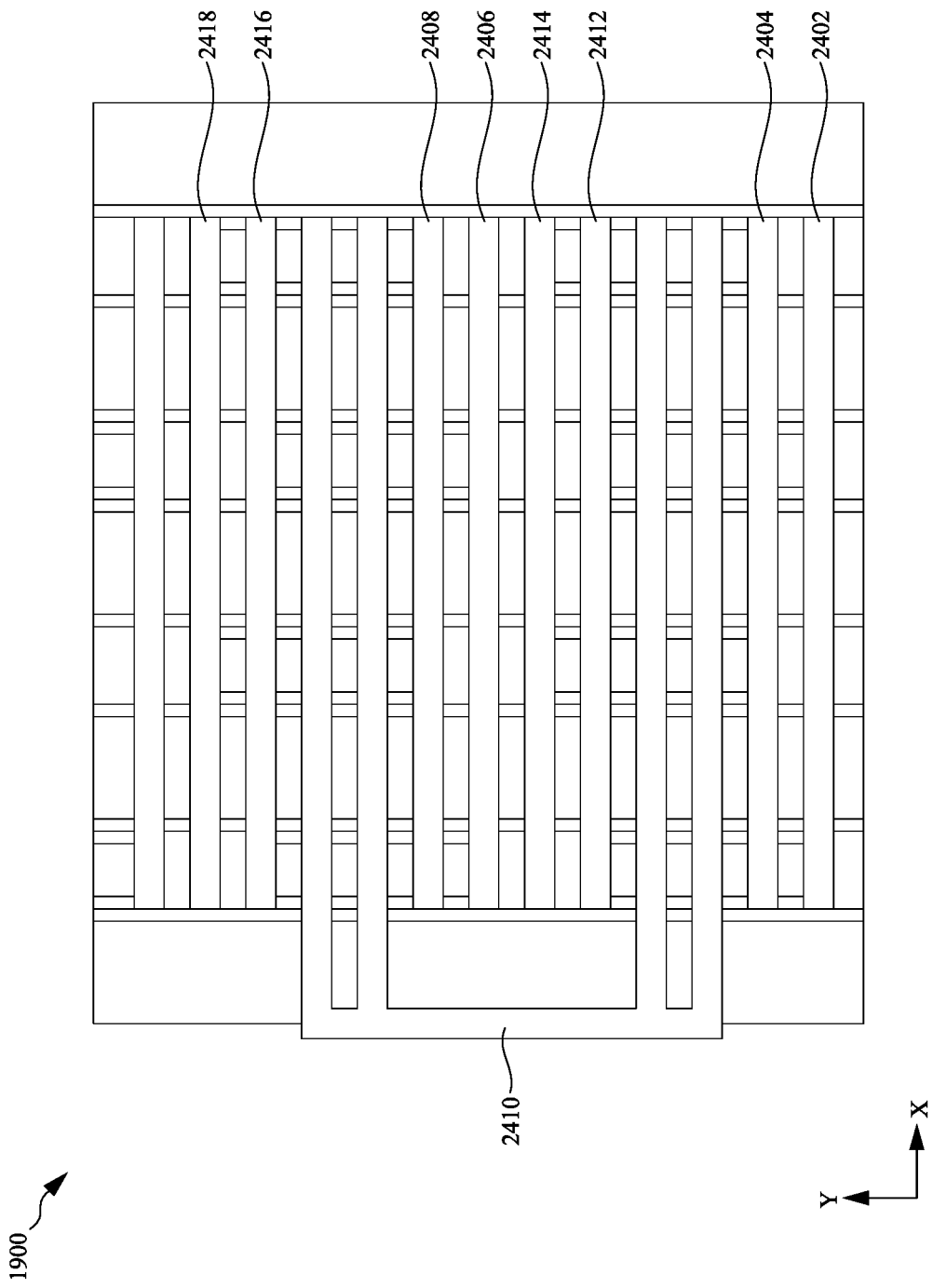

Corresponding to operation 1814 of FIG. 18, FIG. 24A is a perspective view of the 3D memory device 1900 in which metallization layers 2402-2418 are formed at one of the various stages of fabrication, in accordance with various embodiments. Further, FIG. 11B is a top view of the 3D memory device 1900, corresponding to FIG. 11A. In some embodiments, the metallization layers 2402-2408 are formed over the first BLs 2302-2316, the metallization layer 2410 is formed over the SLs 2318-2332, and the metallization layers 2412-2418 are formed over the second BLs 2334-2348. The metallization layers are distributed in a similar fashion as in the metallization layers of FIG. 11A. In various embodiments, the 3D memory device 1900 may be formed during a back-end-of-line (BEOL) process similar to how the memory device 1900 is formed during a back-end-of-line (BEOL) process.

Figure 25:
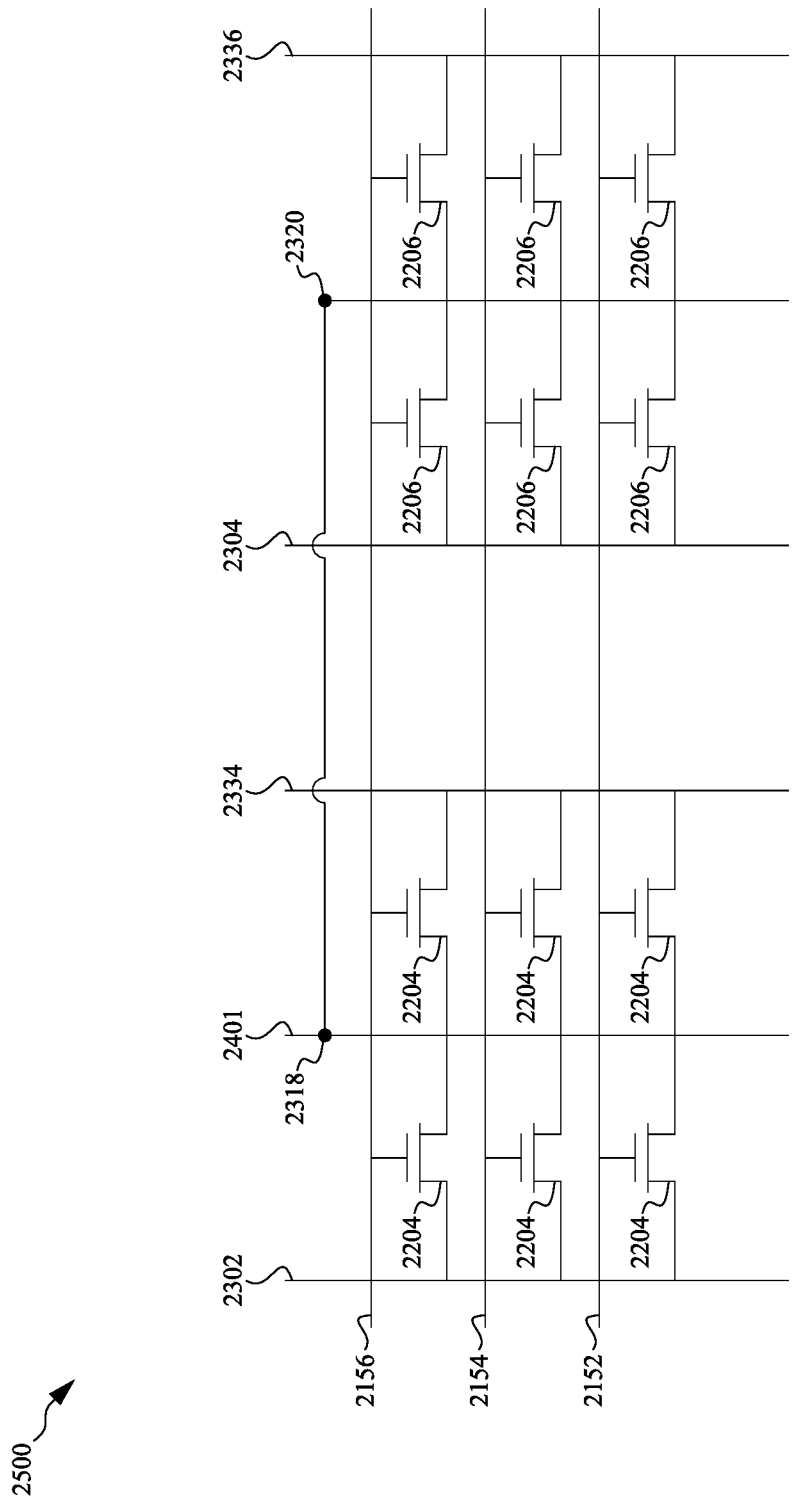
FIG. 25 illustrates a schematic circuit diagram of the example three-dimensional memory device of FIGS. 19-24B, in accordance with some embodiments.

FIG. 25 illustrates a schematic circuit diagram of the example three-dimensional memory device of FIGS. 19-24B, in accordance with some embodiments. In FIG. 25, the memory strings 2204 and 2206 are shown. Each of the memory cells may be represented by a transistor, in which each memory cell can be accessed by a respective combination of WL, BL, and SL. For example, in order to access the top one of the memory cells of the memory string 2204, the WL 2156 may be asserted to select that memory cell, with first BL 2302 (or the second BL 2334) and the SL 2318 applied with suitable levels of signals, as described above.

Figure 26:
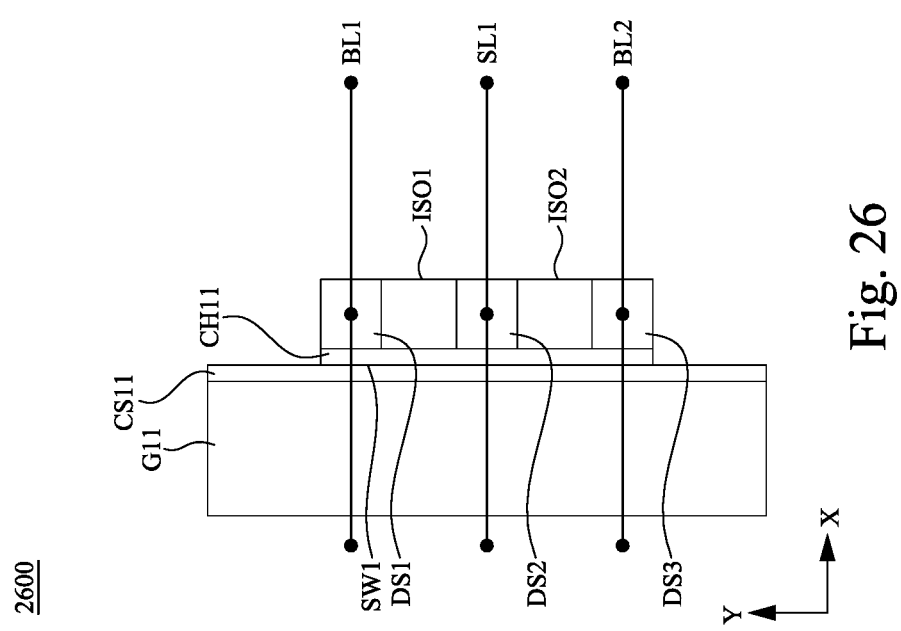
FIG. 26 illustrates a top view of a structure, in accordance with one or more embodiments.

FIG. 26 illustrates a top view of a structure 2600, in accordance with one or more embodiments. In some embodiments, the structure 2600 corresponds to a portion of the 3D memory device 1900. The structure 2600 is similar to the structure 1400 of FIG. 14, except that the channel, charge storage layer, and gate structure of FIG. 26 does not wrap around the drain/source structures DS1, DS2, and DS3.

The structure 2600 includes a channel CH11 (e.g., channel segment 2104A of FIG. 22) similar to the first portion of the channel CH1 of FIG. 14. The channel CH11 is in contact with and/or coupled to a first sidewall of each of the drain/source structures DS1 (e.g., first bit line 2302 of FIG. 23), DS2 (e.g., source line 2318 of FIG. 23), and DS3 (e.g., second bit line 2334 of FIG. 23). For example, the channel CH11 is in contact with and/or coupled to sidewall SW1 of the drain/source structure DS1.

The structure 2600 includes a charge storage layer CS11 (e.g., ferroelectric layer 2102 of FIG. 21) similar to the first portion of the charge storage layer CS1 of FIG. 14. The charge storage layer CS11 is in contact with and/or coupled to the channel CH11. The charge storage layer CS11 is coupled to a first sidewall of each of the drain/source structures DS1, DS2, and DS3 via the channel CH11.

The structure 2600 includes a gate structure G11 (e.g., WL 2156 of FIG. 21) which is coupled to the charge storage layer CS1. Although not shown in FIG. 26, in some embodiments, the structure 2600 includes a second channel coupled to a second sidewall of each of the drain/source structures DS1, DS2, and DS3, a second charge storage layer coupled to the second channel, and a second gate structure coupled to the second charge storage layer.

Figure 27:
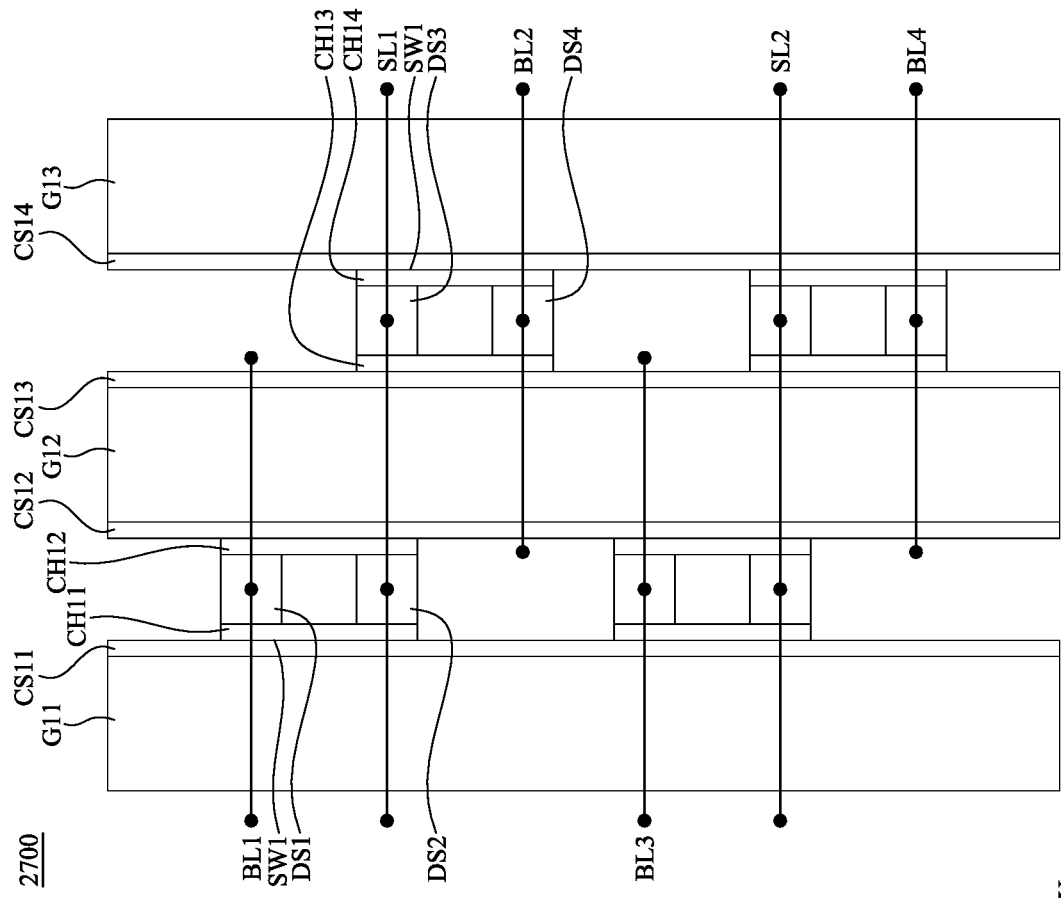
FIG. 27 illustrates a top view of a structure, in accordance with one or more embodiments.

FIG. 27 illustrates a top view of a structure 2700, in accordance with one or more embodiments. In some embodiments, the structure 2700 corresponds to a portion of a third 3D memory. The third 3D memory device can be formed using same process steps as process steps to form the 3D memory device 1900. The structure 2700 is similar to the structure 1500 of FIG. 15, except that the channel, charge storage layer, and gate structure of FIG. 27 do not wrap around the drain/source structures DS1 and DS2.

The structure 2700 includes the channel CH11 of FIG. 26. The channel CH11 is in contact with and/or coupled to a first sidewall of each of the drain/source structures DS1 and DS2.

The structure 2700 includes the charge storage layer CS11 of FIG. 26. The charge storage layer CS11 is in contact with and/or coupled to the channel CH11. The structure 2700 includes the gate structure G11 of FIG. 26. The gate structure G11 is coupled to the charge storage layer CS1.

The structure 2700 includes a channel CH12 coupled to a second sidewall of each of the drain/source structures DS1 and DS2. The structure 2700 includes a charge storage layer CS12 coupled to the channel CH12. The structure 2700 includes a gate structure G12 coupled to the charge storage layer CS12.

The structure 2700 includes a channel CH13 coupled to a first sidewall of each of the drain/source structures DS3 and DS4. The structure 2700 includes a charge storage layer CS13 coupled to the channel CH13. The gate structure G12 is coupled between the charge storage layer CS12 and the charge storage layer CS13.

The structure 2700 includes a channel CH14 coupled to a second sidewall of each of the drain/source structures DS3 and DS4. The structure 2700 includes a charge storage layer CS14 coupled to the channel CH14. The structure 2700 includes a gate structure G13 coupled to the charge storage layer CS14.

Figure 28:
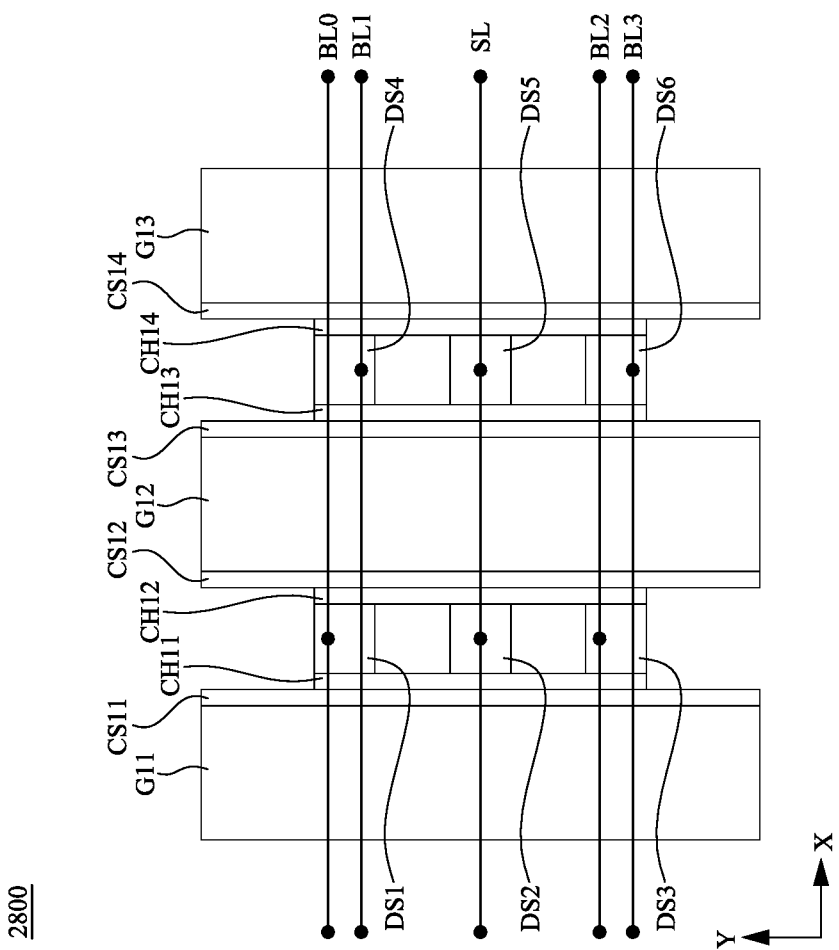
FIG. 28 illustrates a top view of a structure, in accordance with one or more embodiments.

FIG. 28 illustrates a top view of a structure 2800, in accordance with one or more embodiments. In some embodiments, the structure 2800 corresponds to a portion of a fourth 3D memory. The fourth 3D memory device can be formed using same process steps as process steps to form the 3D memory device 1900. The structure 2800 is similar to the structure 1600 of FIG. 16, except that the channel, charge storage layer, and gate structure of FIG. 28 do not wrap around the drain/source structures DS1, DS2, and DS3. In that regard, the structure 2800 is similar to the structure 2700 of FIG. 27.

Figure 29:
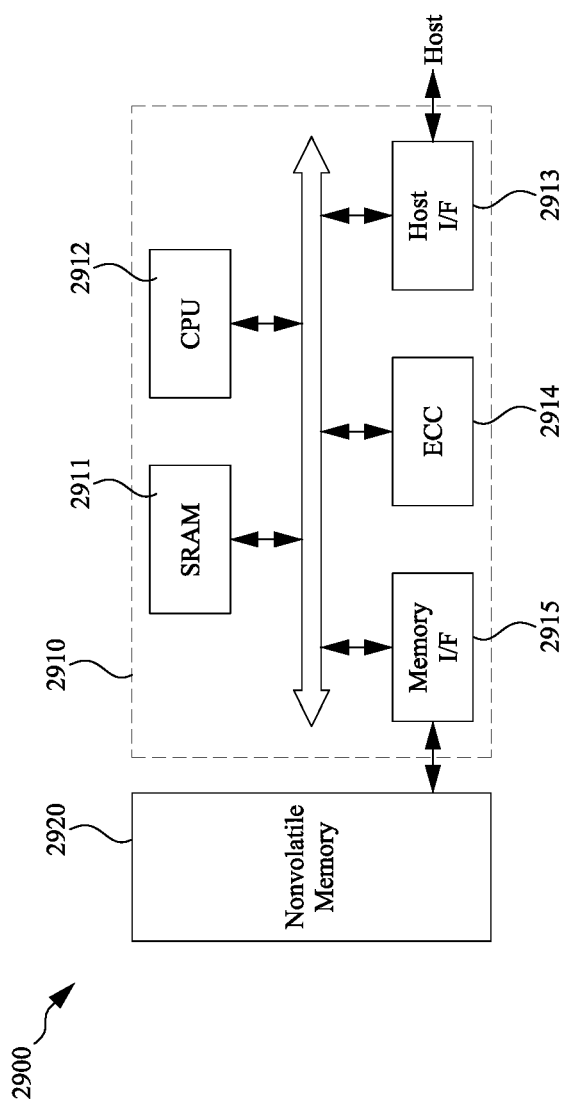
FIG. 29 illustrates a block diagram of an example configuration a memory system that includes the three-dimensional memory device, as disclosed herein, in accordance with some embodiments.

FIG. 29 is a block diagram showing the configuration of a memory system, according to various embodiment of the present disclosure. As shown, a memory system 2900 according to various embodiments of the present disclosure includes a non-volatile memory device 2920 and a memory controller 2910.

The non-volatile memory device 2920 may include the 3D memory device, as disclosed herein. In addition, the non-volatile memory device 2920 may be a multi-chip package composed of a number of ferroelectric memory chips.

The memory controller 2910 is configured to control the non-volatile memory device 2920. The memory controller 2910 may include SRAM 2911, a central processing unit (CPU) 2912, a host interface (I/F) 2913, an error-correcting code (ECC) 2914, and a memory interface 2915. The SRAM 2911 functions as an operation memory of the CPU 2912. The CPU 2912 performs the general control operation for data exchange of the memory controller 2910. The host interface 2913 includes a data exchange protocol of a host being coupled to the memory system 2900. In addition, the ECC 2914 may detect and correct errors included in a data read from the non-volatile memory device 2920. The memory interface 2915 interfaces with the non-volatile memory device 2920. The memory controller 2910 may further store code data to interface with the host.

In one aspect of the present disclosure, a semiconductor device is disclosed. The semiconductor device includes a first drain/source structure extending in a first direction, a second drain/source structure extending the first direction and spaced from the first drain/source structure in a second direction perpendicular to the first direction, a third drain/source structure extending in the first direction and spaced from the second drain/source structure in the second direction, and a first bit line extending in a third direction perpendicular to the first direction and the second direction. The first bit line is disposed over the first drain/source structure in the first direction. The semiconductor device includes a common select line that includes a portion extending in the third direction and disposed over the second drain/source structure in the first direction, a second bit line extending in the third direction and disposed over the third drain/source structure in the first direction, and a charge storage layer coupled to at least a first sidewall of each of the first drain/source structure, the second drain/source structure, and the third drain/source structure.

In some embodiments, the charge storage layer wraps around the first drain/source structure, the second drain/source structure, and the third drain/source structure. In some embodiments, the semiconductor device includes a second charge storage layer coupled to a second sidewall of each of the first drain/source structure, the second drain/source structure, and the third drain/source structure.

In some embodiments, the semiconductor device includes a channel that is coupled between the charge storage layer and the at least first sidewall. In some embodiments, the semiconductor device includes a gate structure coupled to the charge storage layer. In some embodiments, the gate structure wraps around the charge storage layer.

In some embodiments, the semiconductor device includes a fourth drain/source structure spaced from the first drain/source structure in the third direction, a fifth drain/source structure spaced from the fourth drain/source structure in the second direction, a sixth drain/source structure spaced from the fifth drain/source structure in the second direction, and a second charge storage layer coupled to at least a second sidewall of each of the fourth drain/source structure, the fifth drain/source structure, and the sixth drain/source structure. In some embodiments, the portion of the common select line is disposed over the fifth drain/source structure in the first direction.

In some embodiments, the semiconductor device includes a third bit line extending in the and disposed over the fourth drain/source structure in the first direction and a fourth bit line extending in the third direction and disposed over the sixth drain/source structure in the first direction. In some embodiments, the semiconductor device includes a gate structure coupled between the charge storage layer and the second charge storage layer. In some embodiments, the semiconductor device includes a gate structure that wraps around the charge storage layer and the second charge storage layer.

In another aspect of the present disclosure, a semiconductor device is disclosed. The semiconductor device includes a first drain/source structure extending in a first direction, a second drain/source structure extending the first direction and spaced from the first drain/source structure in a second direction perpendicular to the first direction, a third drain/source structure extending in the first direction and spaced from the second drain/source structure a third direction perpendicular to the first direction and the second direction, a fourth drain/source structure extending in the first direction and spaced from the third drain/source structure in the second direction, and a first bit line extending in a third direction perpendicular to the first direction and the second direction. The first bit line is disposed over the first drain/source structure in the first direction. The semiconductor device includes a common select line that includes a portion extending in the third direction and disposed over the second drain/source structure and the third drain/source structure in the first direction, a second bit line extending in the third direction and disposed over the fourth drain/source structure in the first direction, a first charge storage layer coupled to at least a first sidewall of each of the first drain/source structure and the second drain/source structure, and a second charge storage layer coupled to at least a second sidewall of each of the first drain/source structure and the second drain/source structure.

In some embodiments, the first charge storage layer wraps around the first drain/source structure and the second drain/source structure, and the second charge storage layer wraps around the third drain/source structure and the fourth drain/source structure. In some embodiments, the semiconductor device includes a third charge storage layer coupled to a third sidewall of each of the first drain/source structure and the second drain/source structure and a fourth charge storage layer coupled to a fourth sidewall of each of the third drain/source structure and the fourth drain/source structure.

In some embodiments, the semiconductor device includes a first channel that is coupled between the first charge storage layer and the at least first sidewall and a channel that is coupled between the second charge storage layer and the at least second sidewall. In some embodiments, the semiconductor device includes a gate structure coupled between the first charge storage layer and the second charge storage layer. In some embodiments, the gate structure wraps around the first charge storage layer and the second charge storage layer.

In another aspect of the present disclosure, a method for making a memory device is disclosed. The method includes forming a charge storage layer in a vertical direction, forming a first drain/source structure extending in the vertical direction, forming a second drain/source structure extending the vertical direction and spaced from the first drain/source structure in a second direction perpendicular to the vertical direction, and forming a third drain/source structure extending in the vertical direction and spaced from the second drain/source structure in the second direction. The charge storage layer is coupled to at least a first sidewall of each of the first drain/source structure, the second drain/source structure, and the third drain/source structure. The method includes forming, over the first drain/source structure in the vertical direction, a first bit line extending in a third direction perpendicular to the vertical direction and the second direction, forming, over the second drain/source structure in the vertical direction, a common select line that includes a portion extending in the third direction, and forming, over the third drain/source structure in the first direction, a second bit line extending in the third direction.

In some embodiments, forming the charge storage layer includes forming the charge storage layer around the first drain/source structure, the second drain/source structure, and the third drain/source structure. In some embodiments, the method includes forming a second charge storage layer coupled to a second sidewall of each of the first drain/source structure, the second drain/source structure, and the third drain/source structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first metal structure extending in a vertical direction;
   a second metal structure extending in the vertical direction and spaced from the first metal structure in a first lateral direction;
   a third metal structure extending in the vertical direction and interposed between the first metal structure and the second metal structure in the first lateral direction;
   a first semiconductor channel layer surrounding the first metal structure, the second metal structure, and the third metal structure; and
   a first charge storage layer further surrounding the first semiconductor layer.

2. The semiconductor device of claim 1, further comprising:
   a first bit line extending in a second lateral direction perpendicular to the first lateral direction, disposed over the first to third metal structures, and in connection with the first metal structure;
   a common select line that includes a portion extending in the second lateral direction, disposed over the first to third metal structures, and in connection with the third metal structure; and
   a second bit line extending in the second lateral direction, disposed over the first to third metal structures, and in connection with the second metal structure.

3. The semiconductor device of claim 1, further comprising:
   a first isolation region extending in the vertical direction and interposed between the first metal structure and the third metal structure in the first lateral direction; and
   a second isolation region extending in the vertical direction and interposed between the second metal structure and the third metal structure in the first lateral direction.

4. The semiconductor device of claim 3, wherein the first semiconductor channel layer also surrounding the first isolation region and the second isolation region.

5. The semiconductor device of claim 1, further comprising:
   a plurality of word lines spaced from one another in the vertical direction;
   wherein each of the plurality of word lines surrounds the first charge storage layer.

6. The semiconductor device of claim 1, further comprising:
   a fourth metal structure extending in the vertical direction;
   a fifth metal structure extending in the vertical direction and spaced from the fourth metal structure in the first lateral direction;
   a sixth metal structure extending in the vertical direction and interposed between the fourth metal structure and the fifth metal structure in the first lateral direction;
   a second semiconductor channel layer surrounding the fourth metal structure, the fifth metal structure, and the sixth metal structure; and
   a second charge storage layer further surrounding the second semiconductor layer.

7. The semiconductor device of claim 6, further comprising:
   a first bit line extending in a second lateral direction perpendicular to the first lateral direction, disposed over the first to sixth metal structures, and in connection with the first metal structure;
   a second bit line extending in the second lateral direction, disposed over the first to sixth metal structures, and in connection with the fourth metal structure;
   a common select line that includes a portion extending in the second lateral direction, disposed over the first to sixth metal structures, and in connection with the third and sixth metal structures;
   a third bit line extending in the second lateral direction, disposed over the first to sixth metal structures, and in connection with the second metal structure; and
   a fourth bit line extending in the second lateral direction, disposed over the first to sixth metal structures, and in connection with the fifth metal structure.

8. The semiconductor device of claim 7, wherein the first to fourth bit lines and the portion of the common select line are arranged in parallel with one another.

9. The semiconductor device of claim 1, wherein the first charge storage layer includes a ferroelectric layer.

10. A semiconductor device, comprising:
    a plurality of first structures spaced from one another along a first lateral direction; and
    a first word line extending along the first lateral direction and surrounding each of the plurality of first structures;
    wherein each of the plurality of first structures comprises:
      a first metal structure extending in a vertical direction;
      a second metal structure extending in the vertical direction and spaced from the first metal structure in the first lateral direction;
      a third metal structure extending in the vertical direction and interposed between the first metal structure and the second metal structure in the first lateral direction;
      a first semiconductor channel layer surrounding the first metal structure, the second metal structure, and the third metal structure; and
      a first charge storage layer further surrounding the first semiconductor layer.

11. The semiconductor device of claim 10, further comprising:
    a plurality of second structures spaced from one another along the first lateral direction;
    a second word line extending along the first lateral direction and surrounding each of the plurality of second structures;
    wherein each of the plurality of second structures comprises:
      a fourth metal structure extending in the vertical direction;
      a fifth metal structure extending in the vertical direction and spaced from the fourth metal structure in the first lateral direction;
      a sixth metal structure extending in the vertical direction and interposed between the fourth metal structure and the fifth metal structure in the first lateral direction;
      a second semiconductor channel layer surrounding the fourth metal structure, the fifth metal structure, and the sixth metal structure; and
      a second charge storage layer further surrounding the second semiconductor layer.

12. The semiconductor device of claim 11, wherein the first word line and the second word line are isolated from each other.

13. The semiconductor device of claim 11, wherein the first and second charge storage layers each include a ferroelectric layer.

14. The semiconductor device of claim 11, further comprising:
- a first bit line extending in a second lateral direction perpendicular to the first lateral direction, disposed over the first structures and second structures, and in connection with the first metal structure of one of the first structures and with the fourth metal structure of one of the second structures;
- a second bit line extending in the second lateral direction, disposed over the first structures and second structures, and in connection with the second metal structure of one of the first structures and with the fifth metal structure of one of the second structures.

15. The semiconductor device of claim 14, further comprising:
- a common select line that includes a portion extending in the second lateral direction, disposed over the first structures and second structures, and in connection with the third metal structure of one of the first structures and with the sixth metal structure of one of the second structures.

16. The semiconductor device of claim 15, wherein the first bit line, the second bit line, and the portion of the common select line are arranged in parallel with one another.

17. A semiconductor device, comprising:
- a plurality of first structures spaced from one another along a first lateral direction;
- a first word line extending along the first lateral direction and surrounding each of the plurality of first structures;
- a plurality of second structures spaced from one another along the first lateral direction;
- a second word line extending along the first lateral direction and surrounding each of the plurality of second structures;
- wherein each of the plurality of first structures comprises:
  - a first metal structure extending in a vertical direction;
  - a second metal structure extending in the vertical direction and spaced from the first metal structure in the first lateral direction;
  - a third metal structure extending in the vertical direction and interposed between the first metal structure and the second metal structure in the first lateral direction;
  - a first semiconductor channel layer surrounding the first metal structure, the second metal structure, and the third metal structure; and
  - a first charge storage layer further surrounding the first semiconductor layer;
- wherein each of the plurality of second structures comprises:
  - a fourth metal structure extending in the vertical direction;
  - a fifth metal structure extending in the vertical direction and spaced from the fourth metal structure in the first lateral direction;
  - a sixth metal structure extending in the vertical direction and interposed between the fourth metal structure and the fifth metal structure in the first lateral direction;
  - a second semiconductor channel layer surrounding the fourth metal structure, the fifth metal structure, and the sixth metal structure; and
  - a second charge storage layer further surrounding the second semiconductor layer.

18. The semiconductor device of claim 17, wherein the first and second charge storage layers each include a ferroelectric layer.

19. The semiconductor device of claim 17, further comprising:
- a plurality of first bit lines, each of the plurality of first bit lines extending in a second lateral direction perpendicular to the first lateral direction, disposed over the first structures and second structures, and in connection with the first metal structure of each of the first structures and with the fourth metal structure of a corresponding one of the second structures;
- a plurality of second bit lines, each of the plurality of second bit lines extending in the second lateral direction, disposed over the first structures and second structures, and in connection with the second metal structure of each of the first structures and with the fifth metal structure of a corresponding one of the second structures.

20. The semiconductor device of claim 19, further comprising:
- a common select line including a plurality of portions, each of the plurality of portions extending in the second lateral direction, disposed over the first structures and second structures, and in connection with the third metal structure of each of the first structures and with the sixth metal structure of a corresponding one of the second structures.

* * * * *